(12) United States Patent
Tanaka

(10) Patent No.: US 6,366,342 B2
(45) Date of Patent: Apr. 2, 2002

(54) DRIVE APPARATUS, EXPOSURE APPARATUS, AND METHOD OF USING THE SAME

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/797,831

(22) Filed: Mar. 5, 2001

(30) Foreign Application Priority Data

Mar. 21, 2000 (JP) ........................................ 2000-078022

(51) Int. Cl.$^7$ ........................ G03B 27/62; G03B 27/42; G03B 27/58; G03C 5/00; A61N 5/00
(52) U.S. Cl. ............................ 355/75; 355/53; 355/72; 355/77; 430/311; 430/312; 250/492.2
(58) Field of Search ............................. 355/75, 53, 72, 355/77; 430/311, 312; 250/492.2

(56) References Cited

U.S. PATENT DOCUMENTS

| | | | | |
|---|---|---|---|---|
| 3,736,880 A | * | 6/1973 | Ross | 104/148 |
| 4,742,286 A | * | 5/1988 | Phillips | 318/640 |
| 5,031,976 A | | 7/1991 | Shafer | |
| 5,220,454 A | | 6/1993 | Ichihara et al. | |
| 5,473,410 A | | 12/1995 | Nishi | |
| 5,488,299 A | | 1/1996 | Kondo et al. | |
| 5,668,672 A | | 9/1997 | Oomura | |
| 5,684,856 A | * | 11/1997 | Itoh et al. | 378/34 |
| 5,689,377 A | | 11/1997 | Takahashi | |
| 5,717,518 A | | 2/1998 | Shafer et al. | |
| 5,793,052 A | * | 8/1998 | Kawaguchi | 250/559.3 |
| 5,835,275 A | | 11/1998 | Takahashi et al. | |
| 5,844,666 A | | 12/1998 | Van Engelen et al. | |

FOREIGN PATENT DOCUMENTS

| | | |
|---|---|---|
| EP | 0 816 892 A2 | 1/1998 |
| JP | 3-282527 | 12/1991 |
| JP | 4-196513 | 7/1992 |
| JP | 8-171054 | 7/1996 |
| JP | 8-334695 | 12/1996 |
| JP | 9-320956 | 12/1997 |
| JP | 10-3039 | 1/1998 |
| JP | 10-20195 | 1/1998 |
| WO | WO 98/40791 | 9/1998 |

* cited by examiner

Primary Examiner—Russell Adams
Assistant Examiner—Khaled Brown
(74) Attorney, Agent, or Firm—Oliff & Berridge PLC

(57) ABSTRACT

A small, light weight drive apparatus is capable of driving an object in a predetermined direction, as well as being capable of micromotion in a rotation direction and in an orthogonal direction to the predetermined direction. A drive apparatus drives an object within a two dimensional plane including a first axis and a second axis orthogonal to the first axis. The drive apparatus includes a first stage on which the object is placed. A micromotion mechanism slightly drives the first stage in a direction of the second axis and in a rotation direction about a third axis orthogonal to the two-dimensional plane. A second stage holds the first stage without physically contacting the first stage. A non-contact holding mechanism disposed between the first stage and the second stage holds the first stage to the second stage in a non-contact manner allowing for micromotion of the first stage in the second axis direction and in the rotation direction relative to the second stage. A macromotion mechanism drives the second stage in a direction of the first axis. The second stage, the non-contact holding mechanism, the micromotion mechanism, and the macromotion mechanism all are disposed on one side of the first stage relative to the third axis. Because of this, it is possible to adjust the position of the object placed on the stage with high precision in the second-axis and rotation directions. In addition, since the second stage, the non-contact holding mechanism, the micromotion mechanism and the macromotion mechanism are all disposed on one side of the first stage, it is possible to make the apparatus smaller and lighter in weight.

28 Claims, 9 Drawing Sheets

DRIVE APPARATUS, EXPOSURE APPARATUS, AND METHOD OF USING THE SAME

INCORPORATION BY REFERENCE

The disclosure of the following priority application is herein incorporated by reference in its entirety: Japanese Patent Application No. 2000-078022 filed Mar. 21, 2000.

BACKGROUND OF THE INVENTION

1. Field of Invention

The invention relates to a drive apparatus, an exposure apparatus, and to a manufacturing method using the same. In particular, the invention relates to a drive apparatus that drives an object within a two dimensional plane including a first axis and a second axis orthogonal to the first axis, and to an exposure apparatus in which the drive apparatus serves as a mask drive apparatus, and to device manufacturing methods using the same.

2. Description of Related Art

In a lithography process for manufacturing semiconductor devices, liquid crystal display elements, and the like, stationary type exposure apparatus such as the conventional step-and-repeat reduction projection exposure apparatus (a so-called "stepper") have been used. In recent years, along with the advent of highly integrated semiconductor devices and the increased size of wafer substrates and masks or reticles (hereinafter called a "reticle"), scanning exposure apparatus such as stepand-scan type exposure apparatus (a so-called "scanning stepper"), which successively transfers a reticle pattern to a substrate via a projection optical system while moving a reticle and a substrate along a predetermined scanning direction in a synchronous manner are becoming mainstream. These scanning exposure apparatus are capable of exposure of a larger field while using a smaller projection optical system compared to a stepper. As a result, there are advantages in that the manufacture of the projection optical system is less complicated, a high throughput can be achieved, along with an averaging effect due to relative scanning of the substrate and the reticle for a projection optical system, and improved focus depth and distortion.

However, a scanning exposure apparatus requires a drive apparatus for driving a reticle on the reticle side (of the projection optical system) in addition to a stage apparatus on the substrate side for driving a substrate. Scanning exposure apparatus in recent years have used a macromotion and micromotion mechanism in a reticle stage apparatus having a reticle macromotion stage that is moved in a predetermined stroke range in the scanning direction by a pair of linear motors placed on both sides of the stage relative to the non-scanning direction, which is orthogonal to the scanning direction, and that is float supported by air bearings, and the like on a reticle platform. This macromotion stage serves as a drive apparatus on the reticle side. In addition, a reticle micromotion stage is provided, which is slightly driven by voice coil motors, and the like in the scanning direction, the non-scanning direction and the yawing direction.

However, with the conventional drive apparatus on the reticle side mentioned above, the stage apparatus necessarily becomes large due to the linear motors being disposed on both sides of the reticle macromotion stage for driving the reticle macromotion stage in the scanning direction. Also, with this drive apparatus, it is necessary to exchange the reticle (i.e., when a reticle having a different pattern is needed) from a predetermined side relative to the scanning direction (i.e., the side without a laser interferometer for measuring the scan direction position of the reticle micromotion stage (and reticle macromotion stage)), or to move the reticle loader from one side relative to the non-scanning direction, straddle the linear motor stationary member, move onto the reticle stage, and change the reticle.

In the case of the former, it is difficult to obtain a degree of freedom of placement for a reticle loader and a laser interferometer, and, in the case of the latter, up and down movement equal to or greater than the predetermined stroke of at least the reticle loader or the reticle is necessary, and the reticle change sequence necessarily becomes complicated.

Also, because a pair of linear motors for driving in the scanning direction is necessary, the entire drive apparatus becomes larger and heavier.

The application of a drive apparatus capable of moving a stage in a predetermined long stroke direction (i.e., the scanning direction) with an object placed on it, and capable of micromotion in the rotation direction and the direction orthogonal to the long stroke direction is not limited to exposure apparatus, but may also be applied as a sample positioning apparatus in other high precision machines, and the like. It is preferable that such positioning apparatus also be small and light weight.

SUMMARY OF THE INVENTION

The invention was conceived in consideration of such problems, and one object of the invention is to provide a small, yet light weight drive apparatus capable of driving an object in a predetermined direction and capable of micromotion in the rotation direction and in the direction orthogonal to the predetermined direction.

Another object of the invention is to provide an exposure apparatus capable of high precision exposure, and capable of obtaining a degree of freedom of placement for each member that is provided in the vicinity of the mask.

A further object of the invention is to provide a highly integrated device having a detailed pattern with excellent precision, and a manufacturing method of the same.

One aspect of the invention relates to a drive apparatus for driving an object within a two-dimensional plane including a first axis and a second axis orthogonal to the first axis. The drive apparatus includes a first stage on which the object is placed. In addition, a micromotion mechanism slightly drives the first stage in the second axis direction and in the rotation direction about a third axis that is orthogonal to the two-dimensional plane. A second stage holds the first stage in a non-contact manner. A non-contact holding mechanism disposed between the first stage and the second stage holds the first stage to the second stage in a non-contact manner which allows for micromotion of the first stage in the second axis direction and in the rotation direction relative to the second stage. A macromotion mechanism drives the second stage in the first axis direction. The second stage, the non-contact holding mechanism, the micromotion mechanism, and the macromotion mechanism are all placed on one side of the first stage, displaced from the third axis.

Accordingly, a non-contact holding device is disposed between the first stage on which an object is placed and the second stage, and the first stage is held to the second stage in a non-contact manner allowing micromotion of the first stage in the second axis direction and in the rotation direction relative to the second stage. Also, the macromotion mechanism drives the second stage with the first stage in the first axis direction. In addition, the micromotion mechanism slightly drives the first stage in the rotation direction (yawing direction) about the third axis orthogonal to the two-dimensional plane and in the second axis direction. Accordingly, it is possible to adjust the position of an object placed on the first stage with excellent precision in the direction of the second axis and in the yawing direction.

Also, the second stage, the non-contact holding mechanism, the micromotion mechanism, and the macromotion mechanism are all arranged on one side of the first stage on which the object is placed. In other words, the first stage is so-called cantilever supported by the second stage, non-contact holding mechanism, micromotion mechanism, macromotion mechanism, and the like. Therefore, on the other side of the first stage there is no drive system, and thus sufficient space is obtainable. It is sufficient to equip the drive apparatus with at least one macromotion mechanism, a linear motor and the like for stage driving for example, on one side of the first stage.

Therefore, it is possible to drive an object in a predetermined direction (first axis direction), slightly in the rotation direction and in a direction orthogonal to the predetermined direction (the second axis direction), and to make the apparatus smaller and lighter in weight.

According to another aspect of the invention, the non-contact holding mechanisms include electromagnets disposed on the first stage or on the second stage, and magnetic material disposed on the other one of the first stage and the second stage. The non-contact holding mechanisms slightly drive the first stage relative to the second stage in the first axis direction by adjusting the magnetic strength generated by the electromagnets. In such a case, it is not only possible to adjust the position of an object placed on the first stage with excellent precision in the second axis direction and in the yawing direction by the micromotion mechanism, but it is also possible to slightly adjust the object position in the direction of the first axis by the non-contact holding mechanism.

According to another aspect of the invention, the non-contact holding mechanism may also generate a slight drive force in the first axis direction at the center of gravity of the first stage. In such a case, it is possible to prevent unnecessary yawing when making micro adjustments to the first stage position in the first axis direction by the non-contact holding mechanism.

According to another aspect of the invention, the micromotion mechanism includes a plurality of moving members disposed on the first stage, a plurality of voice coil motors comprising stationary members corresponding to each of the moving members, and generating a drive force in the second axis direction by electromagnetic interaction between each moving member. The drive force in the second axis direction within the two-dimensional plane preferably includes the center of gravity of the first stage. In such a case, it is possible to prevent the generation of unnecessary rolling and pitching when slightly driving in the second axis direction of the first stage and in the rotation direction (yawing direction) by the micromotion mechanism. In this case, it is preferable that the micromotion mechanism generate a slight drive force in the second axis direction at the center of gravity position of the first stage when slightly driving the first stage in the second axis direction.

According to another aspect of the invention, the macromotion mechanism is a linear motor including moving members disposed on the second stage, and stationary members to generate a drive force in the first axis direction by electromagnetic interaction with the moving members. In addition, the micromotion mechanism includes a plurality of moving members disposed on the first stage, and a plurality of voice coil motors comprised of stationary members corresponding to each of the moving members and generating a drive force in the second axis direction by electromagnetic interaction with each moving member. A frame is provided on which is disposed the linear motor moving members, each stationary member of the plurality of voice coil motors, a first guide surface to support the second stage in a non-contact manner in the second axis direction, and a second guide surface to support the first and second stages in a non-contact manner in the third axis direction. In such a case, since linear motor moving members form the macromotion mechanism, each stationary member of a plurality voice coil motors forms the micromotion mechanism, a guide surface to support the second stage in a non-contact manner in the second axis direction, and a guide surface to support the first and second stages in a non-contact manner in the third axis direction are disposed on a frame, it is possible to drive the second stage with the first stage as one body in the first axis direction relative to the frame in a non-contact manner by the macromotion mechanism, and to slightly drive the first stage in the second axis direction and the yawing direction relative to the frame in a non-contact manner by the micromotion mechanism during movement.

According to another aspect of the invention, a supporting mechanism is provided to support the frame in a non-contact manner such that the frame is free to move as a result of the reaction force to the drive force of the first and second stages. In such a case, when the first stage is driven in the second axis direction, the moving members of a plurality of voice coil motors comprising the micromotion mechanism are driven with the first stage as one body, and the reaction force to the drive force acts on the frame on which the stationary members of the voice coil motors are disposed. However, since the frame is supported in a non-contact manner by a supporting mechanism such that free movement of the frame is possible, the frame absorbs the reaction force according to the law of conservation of momentum by moving a small distance based on the reaction force. Thus, the center of gravity of the system including the second stage and the frame is maintained in a predetermined position. Also, when the second stage is driven with the first stage in the first axis direction, the moving members of the linear motors comprising the macromotion mechanism are driven with the second stage as one body, and the reaction force to that drive force acts on the frame on which the stationary members of the linear motors are disposed. However, since the frame is supported in a non-contact manner by a supporting mechanism such that free movement of the frame is possible, the frame absorbs the reaction force according to the law of conservation of momentum, and the center of gravity of the system including the first and second stages and the frame is maintained in the predetermined position. Therefore, when the first stage and the second stage are driven, it is possible to cancel with certainty the reaction force to the drive force for each stage, and it is possible to prevent the generation of an unbalanced load that would occur if there was movement of the center of gravity.

According to another aspect of the invention, a vacuum preload hydrostatic gas bearing may be disposed on the opposing surfaces of each guide surface of each stage, and have a compressed gas exhaust nozzle and an exhaust groove linked to a vacuum exhaust duct formed around the exhaust nozzle disposed on the bearing surface of each hydrostatic gas bearing. In such a case, is possible to support each stage with high rigidity by maintaining a fixed gap between the guide surfaces by a balance between the static compressed gas jetted from an exhaust nozzle on the bearing surface of the vacuum preload hydrostatic gas bearing disposed opposing each guide surface and the vacuum exhaust force (vacuum suction force) via the exhaust groove and the vacuum exhaust duct. Also, it is possible to prevent leakage of compressed gas for floatation to the vicinity of the bearing.

According to another aspect of the invention, the first stage may be held in a cantilever manner relative to the third axis direction by at least one of the frame and the second stage. In such a case, it is possible to make the apparatus lighter in weight as well as use the space obtained by such a structure for another purpose.

Another aspect of the invention relates to an exposure apparatus for transferring a mask pattern onto a substrate by concurrent movement of a mask and a substrate, and includes a drive apparatus as described above, wherein a mask serves as the object placed on the first stage; and a substrate stage which moves synchronously in the first axis direction with the first stage.

Accordingly, since a mask serving as an object is placed on the first stage having the drive apparatus, it is possible to place the complete drive system including the second stage, the non-contact holding mechanism, the micromotion mechanism and the macromotion mechanism, and the like, on one side of the first stage, and to obtain sufficient space on the other side of the first stage. By this arrangement, it is possible to obtain a degree of freedom for the placement of each member of the apparatus located in the vicinity of the mask, and since up and down movement of the mask loader, and the like is nearly unnecessary when changing the mask, it is possible to simplify the change sequence as well.

Also, as mentioned above, it is possible to make the drive apparatus smaller and lighter, particularly the moving members (especially of the second stage) that are driven during movement in the first axis direction of the first stage on which a mask is placed. Because of this, high precision exposure is possible by means of improved ability to synchronously control movement between the first stage, on which a mask is placed, in the first axis direction and the substrate stage holding a substrate, and improved throughput is possible by means of shortened concurrent settling time.

Another aspect of the invention is a device manufacturing method including a lithographic process that performs exposure using an exposure apparatus as set forth above. Accordingly, since exposure is performed in the lithographic process using an exposure apparatus as set forth above, it is possible to improve the productivity (including yield) of highly integrated micro devices.

Another aspect of the invention relates to the resulting device made by the above-described exposure apparatus.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
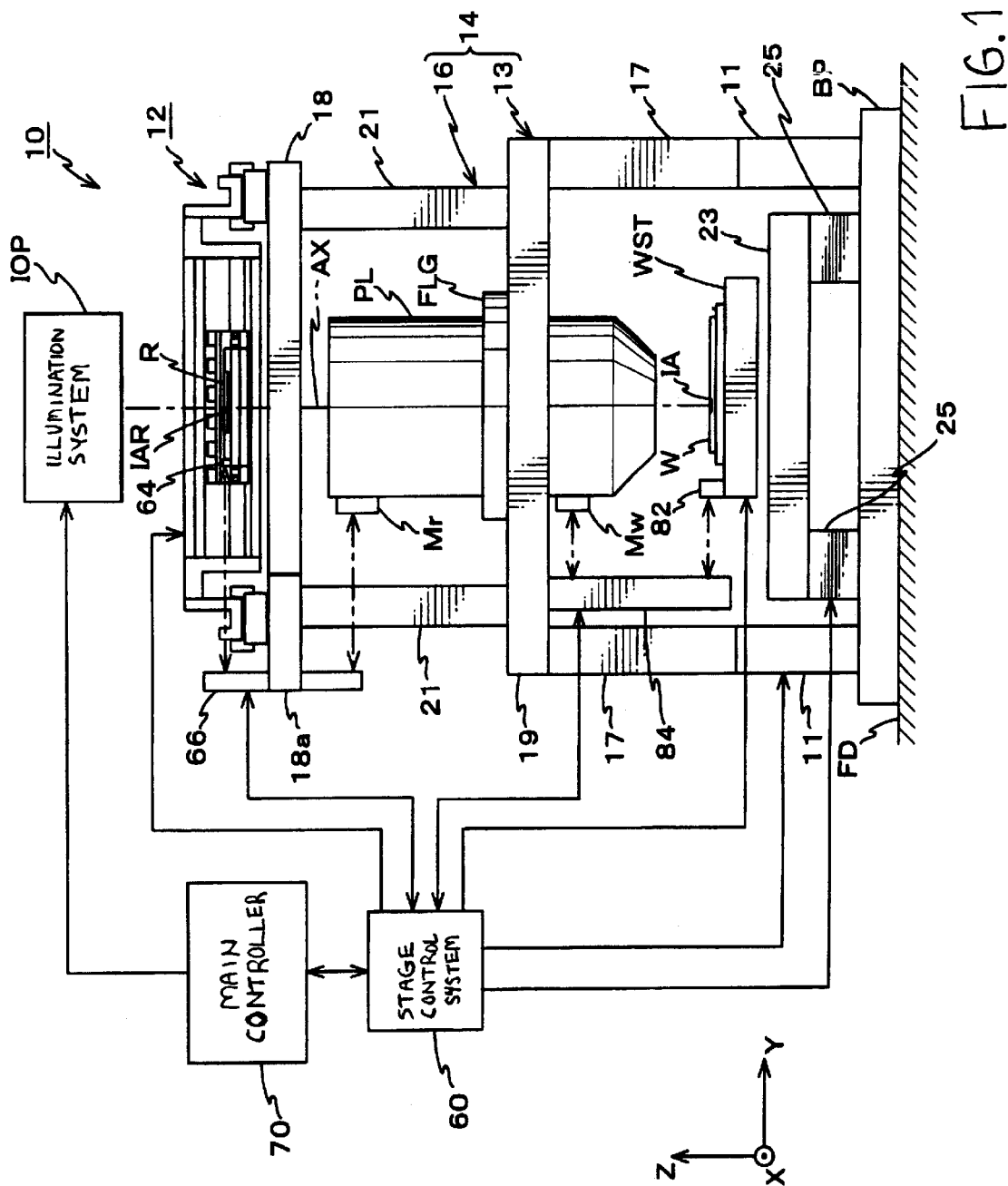
FIG. 1 is a view schematically showing the structure of an exposure apparatus according to a first embodiment of the invention.

FIG. 1 shows the general configuration of an exposure apparatus 10 according to a first embodiment of the invention. This exposure apparatus is a step-and-scan type scanning-exposure apparatus, that is, a so-called scanning stepper. As will be described later, the exposure apparatus of this embodiment includes a projection optical system PL. In the following description: (a) the direction of the optical axis AX of the projection optical system PL is designated the Z-axis direction (the third axis direction); (b) the direction in which a reticle R serving as a mask and a wafer W serving as a substrate are relatively scanned in the plane orthogonal to the Z-axis direction is designated the Y-axis direction; and (c) the direction orthogonal to the Z-axis direction and the Y-axis directions is designated the X-axis direction (the second axis direction).

Exposure apparatus 10 includes an illumination system IOP, a reticle stage apparatus 12 and a wafer stage WST. The reticle R is driven in the Y-axis direction with a predetermined stroke by the reticle stage apparatus 12, which also serves as a drive apparatus for slightly driving the reticle R in the X-axis direction, the Y-axis direction and the $\theta_z$ direction (rotation direction about the Z-axis). The wafer stage WST two dimensionally drives the wafer W in the X and Y directions in the XY plane.

As disclosed in, for example, Japanese Laid-Open Patent Publication Nos. 9-320956 and 4-196513 (U.S. Pat. No. 5,473,410), the illumination system IOP includes a light-source unit, a shutter, a secondary light-source forming optical system, a beam splitter, a light-collecting lens system, a reticle blind, an imaging lens system, and the like (all not shown). The IOP emits illumination light for exposure having a substantially uniform illumination distribution. The exposure light illuminates a rectangular (or arcuate) illumination area IAR on a reticle R at uniform illuminance. Used as the exposure light is, for example, ultraviolet bright lines (e.g., g-rays and i-rays) from an extra-high pressure mercury lamp, or far-ultraviolet or vacuum ultraviolet light such as KrF excimer laser light (with a wavelength of 248 nm), ArF excimer laser light (with a wavelength of 193 nm), $F_2$ laser light, and the like.

Figure 2:
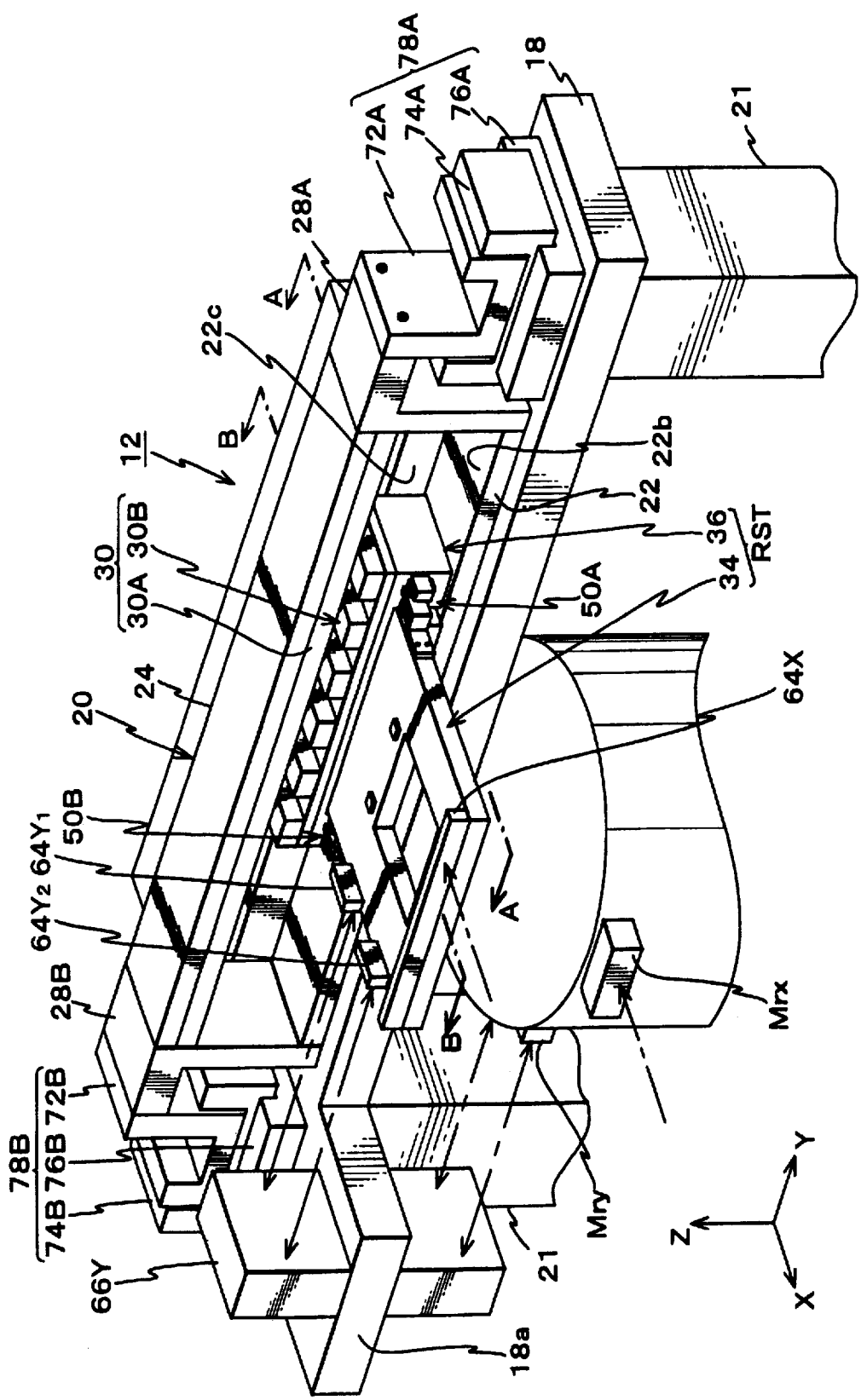
FIG. 2 is a perspective view schematically showing structural components of the reticle stage apparatus in FIG. 1 and members in the periphery of the same.

The reticle stage apparatus 12 is placed on a top plate 18 of a second column constituting a main column 14, which will be described later. The top plate 18 is L-shaped from a plan view as shown in FIG. 2, and the protruding portion in the +X direction (on the left side in FIG. 1) of the −Y edge includes an interferometer attachment member 18a.

The reticle stage apparatus 12 will be explained in detail based on FIG. 2~FIG. 5. FIG. 2 is a perspective view schematically showing the reticle stage apparatus 12 and the structural members in the vicinity of the same. Also, in FIG. 3A a cross-sectional view, taken along A—A in FIG. 2 is shown. As is shown is these figures, the reticle stage apparatus 12 is provided with reticle stage RST and the frame 20 on which a guide surface is formed for guiding the reticle stage RST.

Figure 3A:
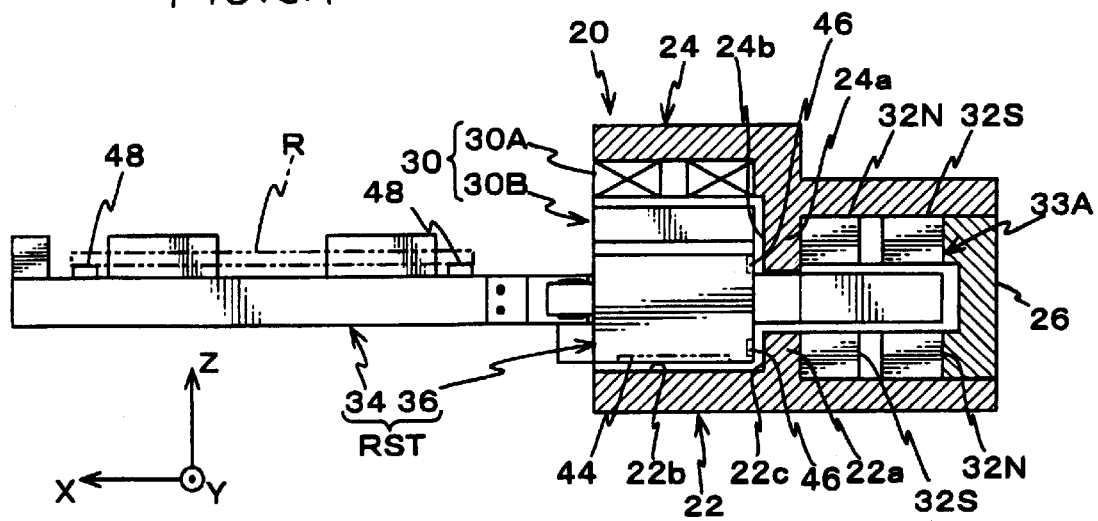
FIG. 3A is a cross-sectional view, taken along A—A in FIG. 2.
Figure 3B:
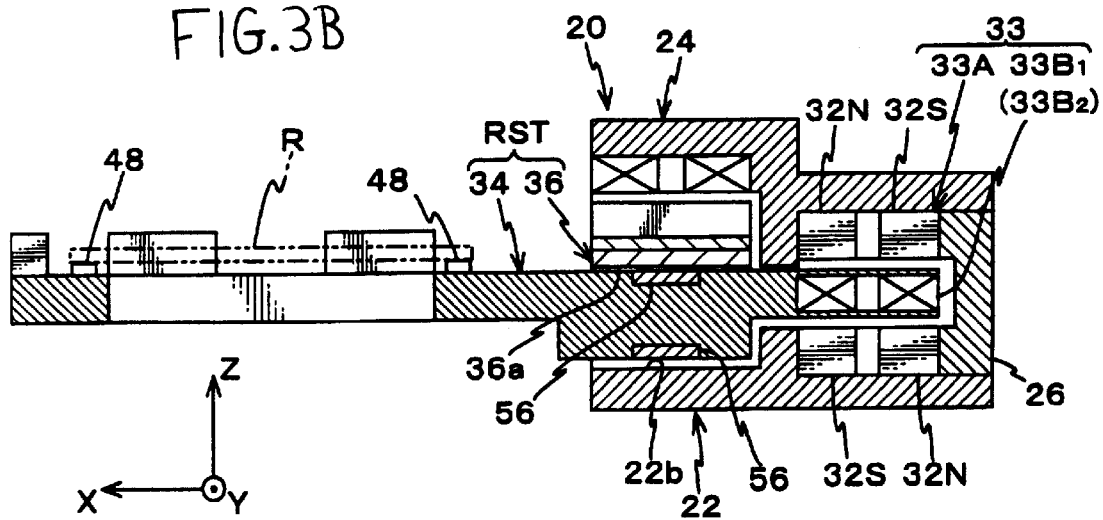
FIG. 3B is a cross-sectional view, taken along B—B in FIG. 2.

The frame 20, as shown in FIGS. 3A and 3B, is provided with: a lower surface plate 22 extending in the Y-axis direction and having a cross-sectional upside-down T-shape; an upper surface plate 24 extending in the Y-axis direction placed opposing the lower surface plate 22; and a back surface plate 26 connecting the back edge (−X side edge) of the lower surface plate 22 and the upper surface plate 24, and extending in the Y-axis direction. Also, a pair of side surface plates 28A, 28B, being L-shaped in the YZ cross-section, are attached to both sides (the surface on both sides in the Y-axis direction) of the lower surface plate 22, the upper surface plate 24 and the back surface plate 26. Because of this, a long thin container shaped frame 20 with the front surface (+X side surface) open is defined of an internal space surrounded by lower surface plate 22, upper surface plate 24, back surface plate 26 and side surface plates 28A, 28B. In the center vicinity in the X-axis direction of the outer surface of the upper plate 24 of the frame 20, a step is formed and moving magnet type linear motor stationary members 30A are fixed on the inner surface (lower surface) of the front (+X side) from this step, as shown in FIG. 2 and FIG. 3A. These stationary members 30A are comprised of a plurality of square hollow armature coils disposed in predetermined intervals along the Y-axis direction within the upper plate 24 plane.

As shown in FIGS. 3A and 3B, a downward extension 24a is formed on the inner surface side of the upper plate 24 opposing an upward extension 22a which is formed in the X-axis direction central vicinity of the lower plate 22. Also, on the back side (−X side) of the downward extension of the inside face of the upper plate 24, one each of an N pole magnet 32N and an S pole magnet 32S is disposed in predetermined intervals in the X-axis direction, each extending in the Y-axis direction. The N pole magnet and the S pole magnet are magnets where the side facing the upper plate 24 and the reverse side facing the gap are respectively the N pole surface and the S pole surface.

On the back side of upward extension 22a on the lower plate 22, an S pole magnet 32S and an N pole magnet 32N are each extended in the Y-axis direction, and face the above-mentioned N pole magnet 32N and S pole magnet 32S respectively. Magnetic pole unit 33A is comprised of these two pairs of magnets. Here, S pole magnets and N pole magnets are magnets where the side facing the lower plate 24 and the reverse side facing the gap are respectively the S pole surface and the N pole surface.

In this case, the upper face of the lower plate 22 is designated as the guide surface 22b for the Z-axis direction, and serves as the second guide surface, and the front face (+X side face) is designated as the guide surface 22c for the X-axis direction, and serves as the first guide surface. Also, the front face of the downward extension 24a of the upper plate 24 is designated as the guide surface 24b for the X-axis direction, and serves as the first guide surface.

The reticle stage RST, as shown in FIG. 2, FIGS. 3A and 3B, provides the reticle micromotion stage 34, and serves as the first stage on which reticle R is placed. The reticle stage RST also provides the macromotion stage 36, which serves as the second stage which moves along with the micromotion stage 34 as one body in the Y-axis direction.

Figure 4:
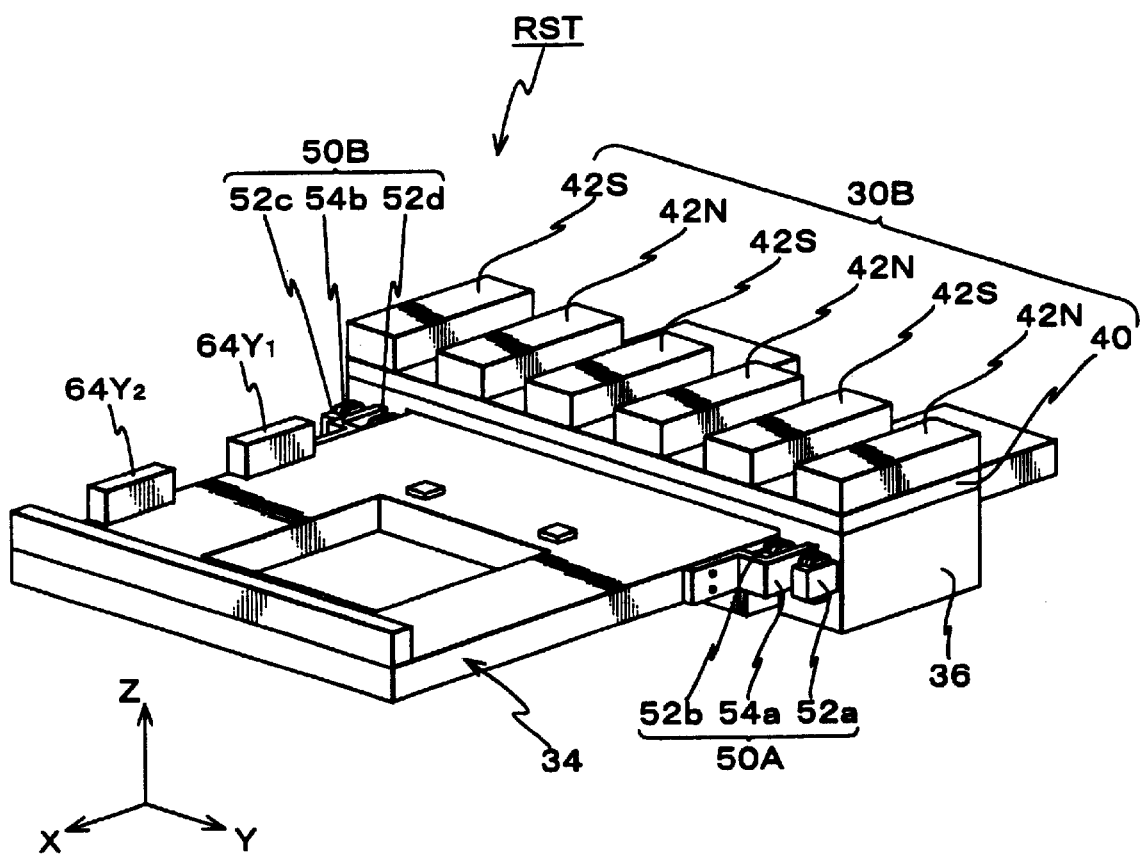
FIG. 4 is a perspective view showing part of the reticle stage removed.
Figure 5:
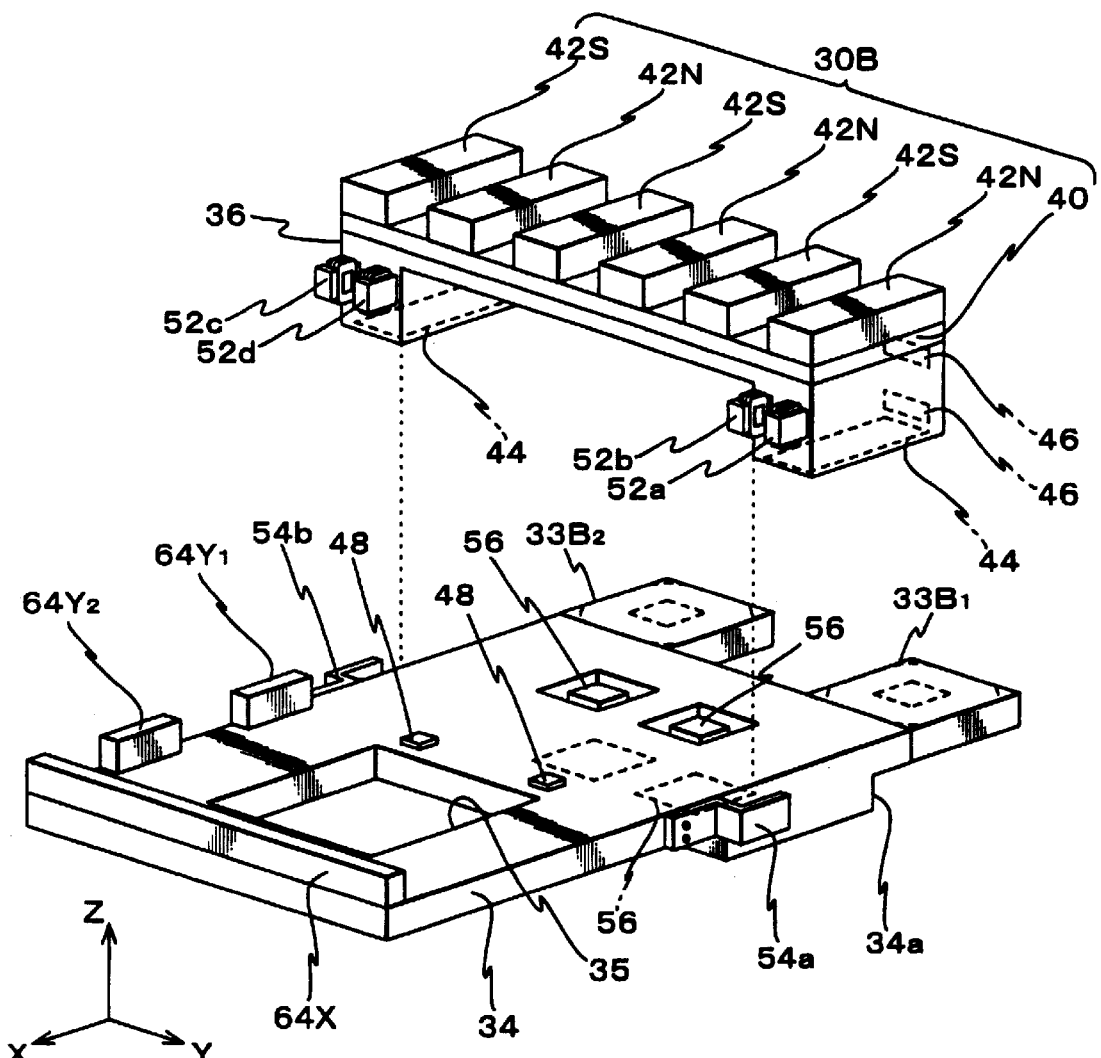
FIG. 5 is a disassembled perspective view showing the reticle stage RST.

FIG. 4 shows part of the reticle stage RST removed, and FIG. 5 shows a broken perspective view of the reticle stage RST. The structure of the reticle stage RST will be explained below based on these figures.

The reticle macromotion stage 36, as shown in FIG. 4 and FIG. 5, has a generally rectangular plan shape short in the X-axis direction and long in the Y-axis direction, and is formed by a non-magnetic body having an upside-down U-shape in the YZ plane. On the upper surface of this reticle macromotion stage 36, a rectangular plate magnetic material 40 is affixed. The N pole magnets 42N and the S pole magnets 42S are disposed alternately in predetermined intervals in the Y-axis direction on the surface of the magnetic material 40. Here, the N pole magnets and the S pole magnets are magnets where the side facing the opposite side of magnetic material are respectively the S pole surface and the N pole surface.

The moving member 30B of the moving magnet type linear motor 30 explained above is comprised of the magnetic material 40, the N pole magnets 42N, and the S pole magnets. This moving member 30 generates an alternating magnetic field having a predetermined cycle in the Y-axis direction in the gap between itself and the stationary members 30A as shown in FIG. 2 where the reticle macromotion stage 36 is incorporated into the frame 20. In other words, the macromotion mechanism for driving the reticle macromotion stage 36 and the reticle micromotion stage 34 with a predetermined stroke in the Y-axis direction is comprised of a moving magnet type linear motor 30 formed of moving member 30B and stationary members 30A. Also, the macromotion mechanism is controlled by stage control system 60, which controls the current value (including direction) supplied to the armature coil comprised of the stationary members 30A of the linear motor 30.

Also, as shown in the FIG. 5 broken perspective view, a pair of vacuum preload hydrostatic gas bearings 44 are disposed on the lower surface of both edges in the Y-axis direction of the reticle macromotion stage 36. These hydrostatic gas bearings 44 with the reticle macromotion stage 36 incorporated into the frame 20, as shown in FIG. 3A, face the Z-axis direction guide surface 22b described above and jet a compressed gas, compressed air, for example, toward the Z-axis direction guide surface 22b. Accordingly, hydrostatic gas bearings 44 float support the reticle macromotion stage 36 and the moving member 30B as one body in a non-contact manner via a clearance of about several millimeters above the guide surface 22b by means of a balance between the total force of the vacuum suction, the total weight of the reticle macromotion stage 36 and the moving member 30B and the static pressure of the compressed gas.

Also, on the back surface (surface of −X side) of both edges in the Y-axis direction of reticle macromotion stage 36, two each of the vacuum preload hydrostatic gas bearings 46 are disposed in predetermined intervals in the vertical direction. When the reticle macromotion stage 36 is incorporated into the frame 20, as shown in FIG. 3A, the upper side hydrostatic gas bearings 46 face X-axis direction guide surface 24b, and the lower side hydrostatic gas bearings 46 face X-axis direction guide surface 22c. Also, these hydrostatic gas bearings 46 jet a compressed gas, compressed air, for example, toward the guide surfaces 24b, 22c that they respectively face, and support the reticle macromotion stage 36 and moving member 30B in a non-contact manner via a clearance of about several millimeters from each respective guide surface by means of a balance between vacuum suction force and the static pressure of the compressed gas.

Each hydrostatic gas bearing 44, 46 includes an exhaust groove linked to a vacuum exhaust duct formed around a compressed gas outlet nozzle on the surface containing the bearings. Thus, since the compressed gas jetted from the outlet nozzle is exhausted via an exhaust groove and a vacuum exhaust dust, the leakage of compressed gas into the surrounding air is effectively prevented.

The reticle micromotion stage 34, as shown in FIG. 5, is comprised of a protruding member 34a with a rectangular shape protruding downward. A rectangular opening 35, which is the pathway of the illumination light for exposure, is formed on the front end of the reticle micromotion stage 34. Two each of vacuum chucks 48 totaling four are disposed in the front and back of the opening 35. Reticle R is held by vacuum suction in the vicinity of the four corners thereof by these four vacuum chucks 48 (refer to FIGS. 3A and 3B).

A pair of armature units 33B1, 33B2 are disposed in a protruding manner from both edges on the back of the reticle micromotion stage 34. The armature units 33B1, 33B2 each have a rectangular case comprised of a non-magnetic material and a square shaped hollow armature coil inside the case. When the reticle micromotion stage 34 is incorporated into the frame 20 with the reticle macromotion stage 36, as shown in FIG. 3B, the armature units $33B_1$, $33B_2$ are positioned between the magnets (above and below) comprising magnetic pole unit 33A. Moving coil type voice coil motors are each comprised of the armature units $33B_1$, $33B_2$ and the magnetic pole unit 33A. The micromotion mechanism is comprised of a pair of voice coil motors which generate micromotion drive force in the X-axis direction at the center of gravity position of the reticle micromotion stage 34, and generate micromotion drive force about the center of gravity in the $\theta_z$ rotation direction.

Thus, in the present embodiment, it is possible to prevent the generation of unnecessary rolling and pitching when the micromotion mechanism slightly drives the reticle micromotion stage 34 in the X-axis direction and in the rotation direction (the yawing direction), and it is also possible to prevent the generation of unnecessary yawing when the micromotion mechanism slightly drives the reticle micromotion stage 34 in the X-axis direction.

The micromotion mechanism is controlled by the stage control system 60, which controls the current value (including direction) of the current supplied to the armature coil units 33B1, 33B2 (the armature coil) which each comprise the pair of voice coil motors 33.

A pair of hydrostatic gas bearings 56 are disposed on the upper surface and a pair of the same are disposed on the lower surface (bottom surface) of the portion near the back end of the reticle micromotion stage 34 as shown in FIG. 5. The pair of hydrostatic gas bearings 56 on the bottom surface, when the reticle micromotion stage 34 is incorporated within the frame 20 with the reticle macromotion stage 36, oppose the above-described Z-axis direction guide surface 22b as shown in FIG. 3B. The pair of hydrostatic gas bearings 56 on the upper surface oppose the Z-axis direction guide surface 36a formed on the lower surface (inside surface) in the center in the Y-axis direction of the reticle macromotion stage 36. In this case, the reticle micromotion stage 34 is supported in a non-contact, and highly rigid manner with a predetermined clearance from the upper and lower guide surfaces 36a, 22b maintained by a balance between the total force of the static pressure of the compressed gas (compressed air, for example) jetted from the hydrostatic gas bearings 56 on the upper surface toward the guide surface 36a and the total weight of the reticle micromotion stage 34 (including the armature units $33B_2$, $33B_1$), and the static pressure of the compressed gas (compressed air, for example) jetted from the hydrostatic gas bearings 56 on the lower surface toward the guide surface 22b. In this case, since the reticle macromotion stage 36, as described above, is float supported by the hydrostatic gas bearings 44 on the bottom surface, the total weight of the reticle macromotion stage 36 hardly effects the floatation support of the reticle micromotion stage 34.

In this case, vacuum preload hydrostatic gas bearings with a structure similar to the above-described hydrostatic gas bearings may serve as the hydrostatic gas bearings 56, and in such a case, the non-contact support of the reticle micromotion stage 34 is realized by a total balance of five forces including the vacuum suction force (the vacuum preload force) of the hydrostatic gas bearings. In this case, not only is the rigidity of the reticle micromotion stage 34 improved, but the rigidity of the reticle macromotion stage 36 is also improved. In this case, as described above, it is possible to effectively prevent the leakage of compressed gas jetted from the hydrostatic gas bearings 56 to the surroundings.

Furthermore, in the present embodiment, as shown in FIG. 4, a pair of non-contact holding mechanisms 50A, 50B to hold the reticle micromotion stage 34 to the reticle macromotion stage 36 in a non-contact manner are disposed between the reticle macromotion stage 36 and the reticle micromotion stage 34 so as to allow micromotion in the XY plane (including $\theta_z$ rotation). One of the non-contact holding mechanisms 50A includes a pair of mutually opposing electromagnets 52a, 52b (refer to FIG. 5) disposed with a predetermined interval therebetween in the Y-axis direction on the front surface of the +Y end of the reticle macromotion stage 36, and iron material 54a fixed to the side of the +Y side of the reticle micromotion stage 34, and serving as magnetic material capable of being inserted in the gap between the electromagnets 52a, 52b. Similarly, the other non-contact holding mechanism 50B includes a pair of mutually opposing electromagnets 52c, 52d (refer to FIG. 5) disposed with a predetermined interval therebetween in the Y-axis direction on the front surface of the −Y end to the reticle macromotion stage 36, and iron material 54b fixed to the side of the +Y side of the reticle micromotion stage 34, and serving as magnetic material capable of being inserted in the gap between the electromagnets 52c, 52d.

Therefore, in the present embodiment, by adjusting the magnetic strength generated by each of the electromagnets 52a, 52b, the magnetic attraction of each to the iron material 54a is adjusted, and by concurrently adjusting the magnetic strength generated by each of the electromagnets 52c, 52d, the magnetic attraction (the magnetic strength) of each to the iron material 54b is adjusted. Thus, the reticle micromotion stage 34 can be slightly moved in the +Y direction or the −Y direction relative to the reticle macromotion stage 36, and it is possible to fine adjust the relative position of the reticle micromotion stage 34 in the Y-axis direction relative to the reticle macromotion stage 36. The adjustment in this case is performed by, for example, briefly increasing the magnetic strength of a predetermined one of the electromagnets 52a, 52b and one of the electromagnets 52c, 52d depending on the desired micromotion direction, starting the reticle micromotion stage 34 movement in the desired direction, and adjusting the magnetic strength generated by each electromagnet such that the strength differential of the magnetic attraction of electromagnets 52a, 52b to the iron material 54a and the magnetic attraction of electromagnets 52c, 52d to the iron material 54b is reversed. Thus, the magnetic attraction of electromagnets 52a, 52b to the iron material 54a and the magnetic attraction of electromagnets 52c, 52d to the iron material 54b each stop the relative movement of the reticle micromotion stage 34 at a point of equilibrium. The relative movement distance is determined by the adjustment of the magnetic strength generated by each electromagnet, and by the adjustment of the adjustment speed, and the like. The adjustment of the magnetic strength generated by each electromagnet is performed by adjustment of the current value flowing in the coils comprising each electromagnet.

Thus, the relative position of the reticle micromotion stage 34 is fine adjusted in the Y-axis direction relative to the reticle macromotion stage 36. The relative position between reticle micromotion stage 34 and reticle macromotion stage 36 relative to the Y-axis direction is adjusted by the stage control system 60 in FIG. 1 controlling the non-contact holding mechanism 50A, 50B. In this case, the relative position of the reticle micromotion stage 34 may be adjusted relative to the reticle macromotion stage 36, or the relative position of the reticle macromotion stage 36 may be adjusted relative to the reticle micromotion stage 34. Such an adjustment can be achieved not only by the non-contact holding mechanism 50A, 50B, but by drive controlling the linear motors 30 and the voice coil motors 33 along with the non-contact holding mechanism 50A, 50B, for example.

The non-contact holding mechanism 50A, 50B generates micromotion in the Y-axis direction at the center of gravity position of reticle micromotion stage 34. Because of this it is possible to prevent the generation of unnecessary yawing during fine adjustment of the Y-axis direction position of the reticle micromotion stage 34 by the non-contact holding mechanism 50A, 50B.

Although not shown, the wiring for a power supply to the armature units $33B_2$, $33B_1$, (armature coils) is connected to the reticle micromotion stage 34 via the reticle macromotion stage 36 from a current supply (not shown), in a slack state such that no pulling force occurs when the reticle micromotion stage 34 is held by the reticle macromotion stage 36 via the non-contact holding mechanism.

Furthermore, a reticle X moving mirror 64X comprised of a planar mirror is fixed on the +X side edge of the reticle micromotion stage 34 upper surface, as shown in FIG. 2, and an interferometric beam from a reticle X interferometer (not shown) is vertically irradiated onto moving mirror 64X. A pair of reticle Y moving mirrors $64Y_1$, $64Y_2$ are fixed on the −Y side edge of the reticle micromotion stage 34 upper surface, as shown in FIG. 2, and an interferometric beam from a reticle Y interferometer 66Y is vertically irradiated onto each of these reticle Y movement mirror $64Y_1$, $64Y_2$.

As shown in FIG. 2, a stationary mirror $M_{rx}$ corresponding to the reticle X interferometer and a stationary mirror $M_{ry}$ corresponding to the reticle Y interferometer are each disposed on the lateral surface of the lens barrel of the projection optical system PL. The reticle micromotion X-axis position is continuously detected at a resolution of about 0.5 nm to 1 nm, for example, by the reticle X interferometer with the stationary mirror M, as a reference. The reticle micromotion stage 34 Y position and $\theta_z$ rotation are continuously detected at a resolution of about 0.5 nm to 1 mn, for example, by the reticle Y interferometer 66Y with the stationary mirror $M_{ry}$ as a reference.

A pair of corner cube mirrors may be used to serve as the reticle Y movement mirrors $64Y_1$, $64Y_2$, and an interferometer beam serving as the reticle Y interferometer 66Y can be projected onto the corner cube mirrors $64Y_1$, $64Y_2$, and a pair of double-pass interferometers may be used to detect the Y-axis position of the corner cube mirrors $64Y_1$, $64Y_2$ having received the reflected light from each. In such a manner, it is possible to detect the Y-axis direction position of the projection position of each interferometric beam with excellent precision, even if there is $\theta_z$ rotation of the reticle micromotion stage 34.

Actually, as explained above, three moving mirrors 64X, $64Y_1$, $64Y_2$, serving as moving mirrors, corresponding reticle X interferometer and reticle Y interferometer, and stationary mirrors $M_{rx}$ and $M_{ry}$ are provided, however, these are shown representatively in FIG. 1 as the reticle moving mirror 64, the reticle laser interferometer 66, and the stationary mirror Mr.

In the following explanation, the position of the reticle stage RST (the reticle micromotion stage 34) within the XY plane (including θz rotation) is measured by the reticle laser interferometer 66. The reticle stage RST positional information (or speed information) from the laser interferometer 66 is sent to a main controller 70 via the stage control system 60. The stage control system 60 controls the reticle stage RST drive based on the reticle stage RST positional information (or speed information) according to instructions from the main controller 70.

As is clear from the explanations up to this point, since the moving mirrors 64X, $64Y_1$, $64Y_2$ and the reticle R are mounted on the reticle micromotion stage 34, it is preferred that the components be made light weight to the degree that minimum necessary strength is obtained. If the strength is insufficient, reinforcing ribs may be disposed on the reverse side of the portion where the reticle R is placed.

Furthermore, in a reticle stage apparatus 12 according to the invention, the frame 20 itself is structured for free micromotion in the XY two dimensional direction. Explaining this further, as shown in FIG. 2, X sliders 72A, 72B being U-shaped in the YZ cross-section are fastened to the +Y side of the side plate 28A and to the −Y side of the side plate 28B of the frame 20. The X sliders 72A, 72B are supported in a free moving manner in the X-axis direction by Y sliders 74A, 74B, which also are U-shaped in the YZ cross-section. The Y sliders 74A, 74B are supported in a free moving manner in the Y-direction by stationary supporting members 76A, 76B, which are U-shaped in the XZ cross-section and which are fixed to the surface of the top plate 18.

At this point, on one end, non-contact bearings, hydrostatic gas bearings for example, are disposed in a plurality of locations between the stationary support member 76A and the Y slider 74A, and in a similar fashion, non-contact bearings, hydrostatic gas bearings, for example, are disposed in a plurality of locations between the Y slider 74A and the X slider 72A.

On the other end, non-contact bearings, hydrostatic gas bearings, for example, are disposed in a plurality of locations between the stationary support member 76B and the Y slider 74B, and in a similar fashion, non-contact bearings, hydrostatic gas bearings for example, are disposed in a plurality of locations between the Y slider 74B and the X slider 72B.

In this embodiment, a first non-contact support mechanism 78A is comprised of a stationary support member 76A, a Y slider 74A and an X slider 72A. Similarly, a second non-contact support mechanism 78B is comprised of a stationary support member 76B, a Y slider 74B and an X slider 72B. The support mechanism to support the frame 20 in a non-contact manner in a freely movable fashion by means of the action of the reaction force to the reticle stage RST Y-axis direction and the X-axis direction drive force is comprised of the first and second non-contact support mechanisms 78A, 78B.

Here, the function of this supporting mechanism (78A, 78B) will be briefly explained. First, when reticle micromotion stage 34 is driven in the X-axis direction, the armature units 33B1, 33B2 being the moving members of the above-described pair of voice coil motors 33 comprising the micromotion mechanism, are driven in the X-axis direction with the reticle micromotion stage 34 as one body, and the reaction force from this movement acts upon frame 20 on which the magnetic pole unit 33A, being a stationary member of the voice coil motors, is disposed. In this case, the frame 20 is float supported in a non-contact manner against the top plate 18 by the supporting mechanisms (78A, 78B). Since the X sliders 72A, 72B are supported in a non-contact manner against the Y sliders 74A, 74B, the action of the reaction force causes the frame 20 to move by a predetermined distance following the law of conservation of momentum. Thus, the reaction force is absorbed without being transmitted to the top plate 18. The center of gravity of the systems including the reticle micromotion stage 34 and the frame 20 are held in a predetermined position.

On one end, when the reticle macromotion stage 36 is driven in the Y-axis direction along with reticle micromotion stage 34, the moving members 30B of the linear motors 30 comprising the macromotion mechanism are driven in the Y-axis direction as one body with reticle macromotion stage 36, and the reaction force acts upon the frame 20 on which the stationary members 30A of the linear motors 30 are disposed. In this case, the frame 20 is float supported in a non-contact manner against the top plate 18 by the supporting mechanisms (78A, 78B), and since the Y sliders 74A, 74B are supported in a non-contact manner against the stationary support members 76A, 76B, the action of the reaction force causes the frame 20 to move by a predetermined distance following the law of conservation of momentum, thereby absorbing the reaction force. Thus, the reaction force is not transmitted to the top plate 18. At this point, the center of gravity of the systems including the reticle stage RST and the frame 20 are held in a predetermined position.

Therefore, when driving the reticle micromotion stage 34 and the reticle macromotion stage 36, it is possible to cancel with certainty the reaction force created by the drive force of each stage, and it is also possible to prevent the generation of an unbalanced load that would accompany any movement of the center of gravity.

Returning to FIG. 1, the main column 14 includes a first column 13 placed via a plurality of vibration-isolating units 11 on a base plate BP that is placed horizontally on a floor FD of a clean room, and a second column 16 placed on the first column 13.

The first column 13 is composed of a plurality of column supports 17, each placed on a respective vibration-isolating unit 11, and a lens barrel surface plate 19 horizontally supported by the column supports 17. In this case, micro vibrations to be transmitted from the floor FD to the main column 14 including the lens barrel surface plate 19 are isolated by the vibration-isolating units 11 on the micro gravity level.

The second column 16 is composed of two leg portions 21 embedded in the upper surface of the first column 13, and the above-described top plate 18 horizontally supported by the leg portions 21.

In this case, as is easily appreciated from FIG. 2, due to the presence of the reticle stage apparatus 12 on the top plate 18 on the second column 16, a static unbalanced load acts upon the lens barrel surface plate 19. Considering this point, in the present embodiment, active vibration-isolating units are provided with actuators such as internal pressure adjustable air mounts, voice coil motors, and the like serving as the vibration-isolating units 11 described above, and these vibration-isolating units are controlled by the stage control system 60 based on the output from displacement sensors (not shown), thereby continuously maintaining the lens barrel surface plate 19 in a horizontal posture.

The projection optical system PL is inserted from above through an opening (not shown) formed in the center of the lens barrel surface plate 19, and is supported by the lens barrel surface plated 19 via a flange FLG formed at about the center of a barrel thereof in the height direction. The projection optical system PL is a refracting optical system that is formed of a double side telecentric reduction system composed of a plurality of lens elements arranged at predetermined intervals along the optical-axis direction AX (the Z-axis direction). The projection optical system PL also may be a reduction system that is one-side telecentric (for example, telecentric only on the side of the wafer stage WST). The projection magnification of the projection optical system PL is set at, for example ¼, ⅕, or ⅙. For this reason, when the illumination area IAR on the reticle R is illuminated with illumination light from the illuminations optical system IOP, a reduced image (partial inverted image) of a circuit pattern in the illumination area IAR of the reticle R is formed on an exposure are IA of a wafer W having a photoresist applied on its surface which is conjugate with the illumination area IAR, via the projection optical system PL by the illumination light passed through the reticle R.

A wafer is fixed on the upper surface of the wafer stage WST via a wafer holder (not shown) by electrostatic suction or vacuum suction. The wafer stage WST is Y-axis and the X-axis two-dimensionally driven by a wafer stage drive (not shown) comprised of a magnetic floatation type two-dimensional linear actuator, and the like, above a stage surface plate 23 which is horizontally supported via a plurality of vibration-isolating units 25 placed on the base plate BP. In other words, the wafer stage WST is constituted such that not only is movement allowed in the scanning direction (Y-axis direction), but movement is also allowed in the non-scanning direction (X-axis direction) orthogonal to the scanning direction so that it is possible to position a plurality of shot areas on a wafer in an exposure area conjugate with the illumination area IAR on the reticle, and performs repeated step-and-scan operations consisting of movement for scan exposing (scanning) each shot area on a wafer, and stepping movement for moving to the scan start position for exposing the next shot area.

On the upper surface of the wafer stage WST, a movable mirror for measuring the X-position is disposed on one end in the X-axis direction, and extends in the Y-axis direction, and a movable mirror for measuring the Y position is disposed on one end in the Y-axis direction, and extends in the X-axis direction. In FIG. 1 the movable mirrors are collectively represented by a movable mirror 82. A wafer interferometer for measuring the X-position opposite to the movable mirror for measuring the X-position (hereinafter simply referred to as "wafer interferometer" for convenience) and a wafer interferometer for measuring the Y-position opposite to the movable mirror for measuring the Y-position are placed, and interferometric beams from each wafer interferometer are irradiated toward the opposing movable mirrors. In FIG. 1 the wafer interferometers are collectively represented by wafer interferometer 84.

Stationary mirrors for measuring the wafer stage WST position are fixed in the lower end vicinity of the lens barrel of the projection optical system PL. As described above, the stationary mirrors for measuring the wafer stage position include a stationary mirror for measuring the X-position and a stationary mirror for measuring the Y-position placed corresponding to the movable mirrors and the wafer interferometers for measuring the X-position and the Y-position respectively. In FIG. 1 the stationary mirrors are collectively represented by stationary mirror $M_w$.

The X, Y, θz direction position of the wafer stage WST is continuously measured at a resolution of about 0.5 nm to 1 nm, for example, with the projection optical system PL as a reference. The positional information of the wafer stage WST from the wafer interferometer 84 is sent to the stage control system 60 and the main controller 70, and the stage control system 60 drives the wafer stage WST via a wafer driver (not shown) based on the positional information (or speed information) about wafer stage WST according to directions from the main controller 70.

Similar to what was described above, active type vibration-isolating units serve as vibration-isolating units 25, and this plurality of vibration-isolating units are controlled based on the output of acceleration sensors and displacement sensors (not shown), and thereby the effect of the unbalanced load and the effect of the reaction force accompanying the wafer stage WST drive is reduced.

Next, the flow of the exposure operation according to exposure apparatus 10 structured as described above will be explained.

Reticle loading and wafer loading are performed by a reticle loader and a wafer loader under the management of the main controller. Preparatory work for reticle alignment, base line measurement (measurement of the projection optical system PL light axis distance from the detected center of the alignment detection system), and the like are performed in a predetermined order using a reticle microscope, a fiducial mark plate on the wafer stage WST, an off axis alignment detection system (not shown), and the like.

Subsequently, alignment measurement of Enhanced Global Alignment (EGA), and the like using an alignment detection system (not shown) is performed by the main controller 70. In the case that movement of wafer W is required in this sort of operation, the main controller 70 moves the wafer stage WST holding a wafer W in a predetermined direction via the stage control system 60. After the alignment measurement is complete, scan-and-step exposure operations are conducted as follows.

The wafer stage WST is moved so that the wafer XY position is located at the scan start position for exposing the first shot. Concurrently, the reticle stage RST is moved so that the reticle XY position is located at the scan start position. Then scanning exposure is performed by the stage control system 60 concurrently moving the reticle R (reticle stage RST) and the wafer W (wafer stage WST) based on the positional information of the wafer W measured by the wafer interferometer, and the positional information of reticle R measured by the reticle interferometer 66 according to instructions from the main controller 70.

When the transfer of a reticle pattern for one shot area is completed, the wafer stage WST is stepped by one shot area, and scanning exposure is performed to that shot area. Stepping and scanning exposure is repeated in sequence, and the required number of shot patterns are transferred to the wafer W.

As explained above, the present embodiment adopts the above-explained reticle stage apparatus 12 serving as a drive apparatus for driving reticle R, and the reticle micromotion mechanism 34 is held to the reticle macromotion stage 36 by the non-contact mechanism (50A, 50B) in a non-contact manner that permits X, Y, $θ_z$ rotation. In this case, since it is possible to slightly drive the reticle micromotion stage 34 holding reticle R in the X-axis direction and in the $θ_z$ direction by a pair of voice coil motors, it is possible to adjust the X-position and the yawing of the reticle R with excellent precision. The reticle macromotion stage 36 and the reticle micromotion stage 34 are driven as one body by the linear motors 30 in the Y-axis direction with a predetermined stroke range, and since it is possible to slightly drive the reticle micromotion stage 34 holding the reticle R in the Y-axis direction by the non-contact holding mechanism (50A, 50B), it is possible to adjust the Y-axis direction position of the reticle R with excellent precision.

In other words, it is possible to drive the reticle R in the Y-axis direction with a predetermined stroke range by the reticle stage apparatus 12.

The reticle macromotion stage 36, the non-contact holding mechanism 50A, 50B, the linear motors 30, the voice coil motors 33, and the like are all placed on one side (the −X side relative to the axis AX) of the reticle micromotion stage 34. In addition, the reticle micromotion stage 34 on which the reticle R is placed is supported in a so-called cantilever manner by reticle macromotion stage 36, the non-contact holding mechanism 50A, 50B, the linear motors 30, the voice coil motors 33, and the like. Thus, on the other side (the +X side) of the reticle micromotion stage 34 there is no drive system, and sufficient space can be obtained, so the linear motors for stage driving serving as a macromotion mechanism may also be disposed on only one side of the reticle micromotion stage 34.

Thus, in an exposure apparatus 10 according to this embodiment providing the reticle stage apparatus 12, it is possible to obtain a degree of freedom for the placement of the reticle laser interferometer, the reticle loader, and the like, for example, and it is also possible to obtain a degree of freedom for the reticle loading space. Since up and down movement of the reticle loader, and the like is practically unnecessary when changing the reticle, it is possible to make the exchange sequence simple. For example, in FIG. 2, it is possible to place the reticle loader mechanism (not shown) on the +X side of the reticle micromotion stage 34 and on the +Y side of the reticle macromotion stage 36. In this case, when transferring a reticle to the reticle micromotion stage 34 from the reticle loader mechanism, it is possible to carry a reticle from the +Y side of the reticle micromotion stage 34 (the opposite side from the moving mirrors $64Y_1$, $64Y_2$), and when moving a reticle to the reticle loader mechanism from the reticle micromotion stage 34 (when unloading), it is possible to carry a reticle from the +X side of the reticle micromotion stage 34 (the moving mirror 64X side).

A smaller, lighter reticle stage apparatus 12 is possible, and since it is possible to obtain lighter moving members (especially the reticle macromotion stage 36) driven in the Y-axis direction during movement of the reticle micromotion stage 34 on which reticle R is placed, it is possible to improve the position control of the reticle macromotion stage 36 and the reticle micromotion stage 34.

Therefore, during scanning exposure, high precision exposure is possible by improved synchronization in the Y-axis direction of the reticle micromotion stage 34 (reticle stage RST) and the wafer stage WST which holds wafer W, and it is possible to also improve the throughput by shortened concurrent settling time.

The reaction force accompanying the X-axis direction drive and the Y-axis direction (that is, the Y-axis direction drive of the reticle macromotion stage 36) drive of the reticle micromotion stage 34 is cancelled by movement of the frame 20 supported by the support mechanism (78A, 78B) following the law of conservation of momentum as described above. Therefore, it is possible to cancel with certainty the reaction force to the drive force of each stage when driving the reticle micromotion stage 34 and the reticle macromotion stage 36. In this case, it is possible to also prevent the generation of an unbalanced load due to the movement of each stage 34, 36. Since the reaction force during the movement of each stage 34, 36 is not transmitted to the top plate 18, and in turn is not transmitted to the main column 14, it is possible to effectively restrict the vibrations of the main column 14 due to reticle drive, and in turn effectively restrict the vibrations of the projection optical system PL. Concerning this point as well, improved exposure precision and pattern transfer precision can be achieved.

Next, a second embodiment will be described with reference to FIG. 6 and FIG. 7. The same reference numerals will be used for the same or similar components of the first embodiment described above, and their description may be simplified or omitted. In the second embodiment, the structure of the reticle stage apparatus differs from the first embodiment explained above, and since the structure of the other components is the same, the following explanation will focus on the differences.

Figure 6:
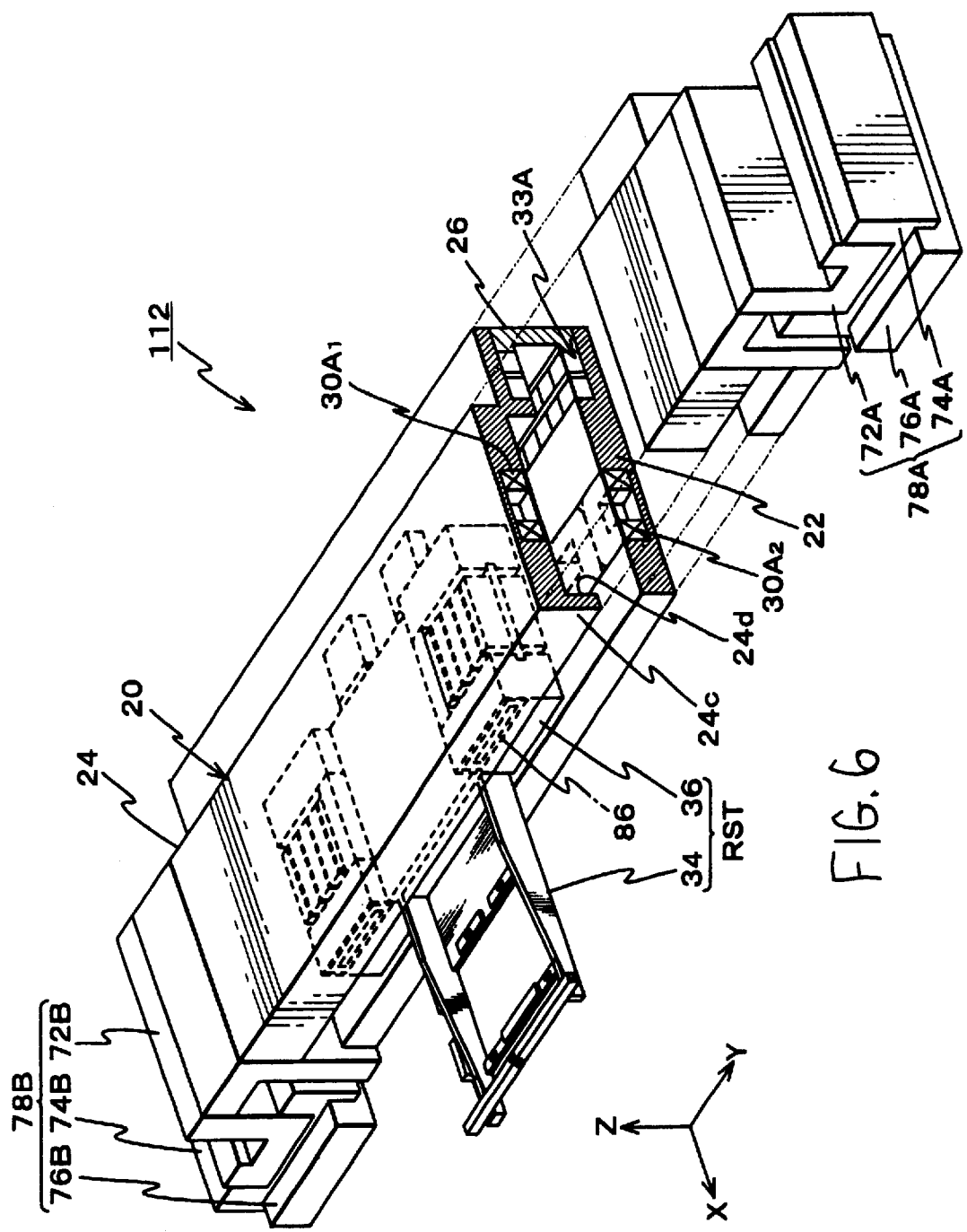
FIG. 6 is a partly broken view showing the reticle stage apparatus of an exposure apparatus according to a second embodiment of the invention.
Figure 7:
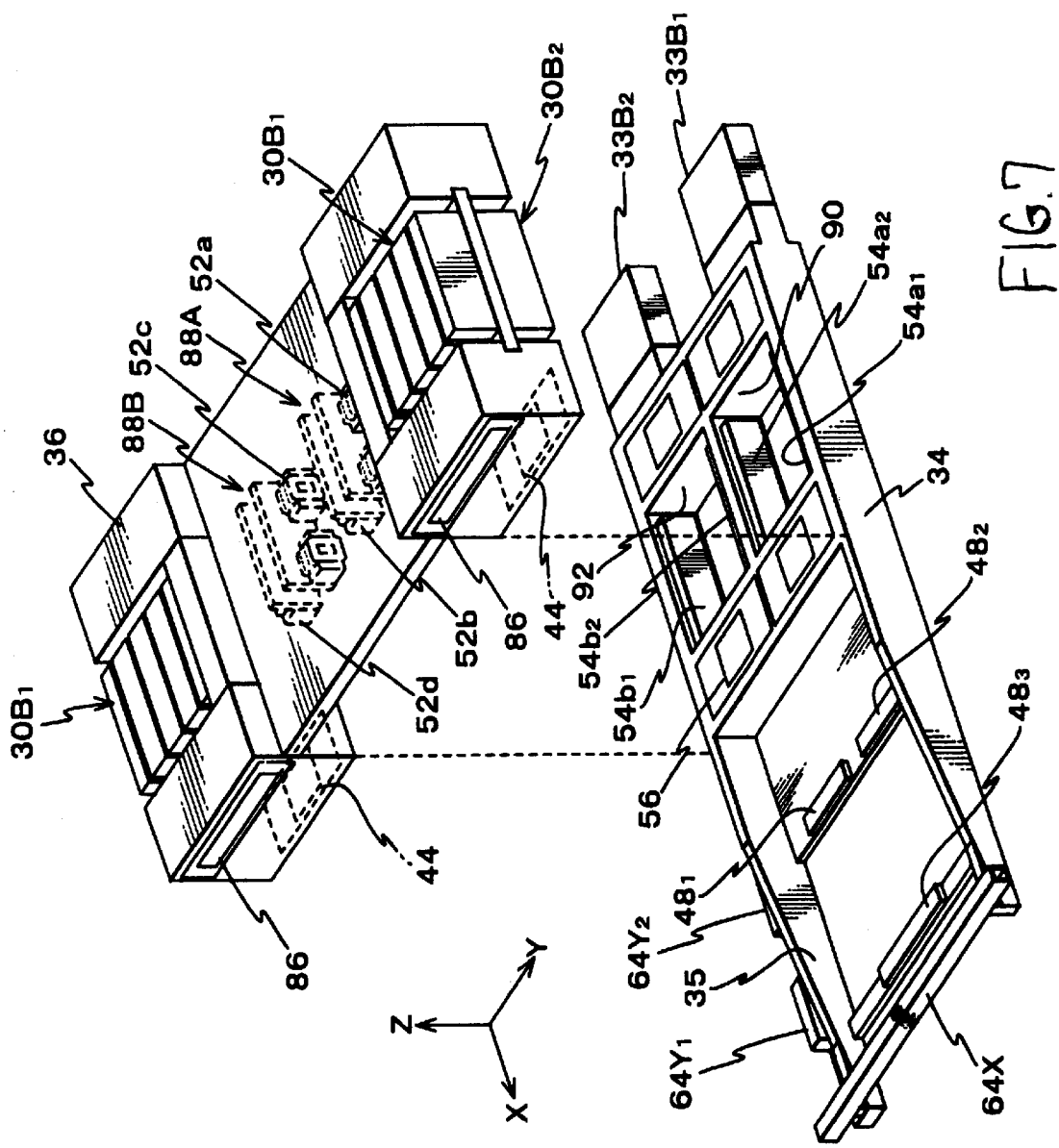
FIG. 7 is a disassembled perspective view showing the reticle stage of the apparatus in FIG. 6.

FIG. 6 is a partly broken view showing the reticle stage apparatus 112, which is part of an exposure apparatus according to the second embodiment. In FIG. 7, a disassembled perspective view of the reticle stage RST in FIG. 6 is shown.

As is clear upon comparison of FIG. 2 and FIG. 6, the reticle stage apparatus 112 is greatly different in external appearance from the above-described reticle stage apparatus 12, however, the basic functions are the same, and differ only by a. to d. listed below.

a. In this reticle stage apparatus 112, a downward extension 24c is disposed on the front end of the upper plate 24 of the frame 20, and an inner surface 24d of the downward extension 24c is designated as the guide surface for the X-axis direction. The hydrostatic gas bearings 86 are disposed on the front surface of the reticle macromotion stage 36 opposing the guide surface 24d.

b. The armature units $30A_1$, $30A_2$ (stationary members of the linear motors) are mutually opposed and extend in the Y-axis direction in the portion slightly in front of the center in the front-back direction (X-axis direction) of the upper plate 24 and the lower plate 22 comprising the frame 20. On the upper and lower surfaces of the reticle macromotion stage 36 corresponding to the armature units $30A_1$, $30A_2$, a pair of respective magnetic pole units $30B_1$, $30B_2$, as shown in FIG. 7, being the moving members of the linear motors similar to the above-described moving member 30B, are disposed in predetermined intervals in the Y-axis direction (the magnetic pole unit $30B_1$, on the lower surface of one side is not shown). In other words, in the second embodiment, one linear motor is comprised of armature unit $30A_1$ and a pair of magnetic pole units $30B_1$, and similarly another linear motor is comprised of the armature unit $30A_2$ and a pair of magnetic pole units $30B_2$. The macromotion mechanism for driving the reticle macromotion stage 36 with the reticle micromotion stage 34 as one body in a predetermined stroke in the Y-axis direction is comprised of the set of linear motors.

c. As shown in FIG. 7, two each of the electromagnets 52a, 52b, 52c, 52d are affixed to the lower surface toward the center in the Y-axis direction of the reticle macromotion stage 36 via affixing material. In this case, two each of the electromagnets 52a, 52b, 52c, 52d are each disposed in predetermined intervals in the X-axis direction. The two electromagnets 52a and the two electromagnets 52b are disposed with the back sides thereof opposing each other, and comprise one electromagnet unit 88A. Similarly, the two electromagnets 52c and the two electromagnets 52d are disposed with the back sides thereof opposing each other, and comprise one electromagnet unit 88B. Corresponding to the electromagnetic units 88A, 88B, two rectangular openings 90, 92 are formed in the reticle micromotion stage 34 aligned along the Y-axis direction such that the electromagnetic units 88A, 88B are each capable of being inserted therein with a predetermined clearance. Iron plates $54a_1$, $54a_2$ serving as magnetic material are attached to both side surfaces in the Y-axis direction of the opening 90. Also, iron plates $54b_1$, $54b_2$ serving as magnetic material are each attached to both side surfaces in the Y-axis direction of the opening 92. In this case, with the reticle micromotion stage 34 incorporated into the reticle macromotion stage 36 as shown in FIG. 6, two electromagnets 52a oppose the iron plate $54a_1$, two electromagnets 52b oppose the iron plate $54a_2$, two electromagnets 52d oppose the iron plate $54b_1$, and two electromagnets 52c oppose the iron plate $54b_2$. In other words, a non-contact holding mechanism, having equivalent function as the above-mentioned non-contact mechanism 50A, is comprised of the electromagnetic unit 88A and the iron plates $54a_1$, $54a_2$, and a non-contact holding mechanism, having equivalent function as the above-mentioned non-contact mechanism 50B, is comprised of the electromagnetic unit 88B and the iron plates $54b_1$, $54b_2$.

d. Furthermore, in the reticle stage apparatus 112, vacuum chucks $48_1$, $48_2$, $48_3$ are disposed to support reticle R at three points at the front and back of the opening 35 in the vicinity of the front end of the reticle micromotion stage 34.

The components of the exposure apparatus other than the reticle stage apparatus 112 and the other components of the reticle stage apparatus 122 are structured similarly to the above-described first embodiment.

According to an exposure apparatus provided with reticle stage apparatus 112, it is possible to obtain a similar effect as the above-described first embodiment, and since the reticle macromotion stage 36 is driven in the Y-axis direction while being supported in a non-contact manner from the front and from the back by the guide surfaces 24d, 24b opposing the hydrostatic gas bearings 86, 46 disposed in the front and the back, the support rigidity of the reticle macromotion stage 36 in the X-axis direction is improved, and it is possible to prevent with near certainty the generation of reticle macromotion stage 36 yawing.

The case where a drive apparatus according to the invention applied to the reticle stage apparatus of a scanning type DUV exposure apparatus has been described in each of the above embodiments. However, the drive apparatus of the invention is not limited to this application, but may be suitably applied as a mask stage apparatus of a proximity type aligner for transferring a mask pattern to a substrate by the contact of a mask to a substrate without use of a projection optical system, or applied to a mask stage apparatus such as a scanning type exposure apparatus using the batch transfer method for liquid crystals.

Additionally, if an apparatus is capable of driving a stage on which an object (a sample) is placed in a predetermined first axis direction, and the apparatus requires micromotion in the direction orthogonal to the first axis and/or motion about a rotation axis, then the drive apparatus of the invention is suitably applicable to not only an exposure apparatus, but to a sample positioning apparatus in other precision machines.

The exposure apparatus of the invention may use, as exposure light, not only the above-described far ultraviolet light or vacuum ultraviolet light, but also soft X-ray EUV light having a wavelength of 5 nm to 30 nm. For example, vacuum ultraviolet light includes ArF excimer laser light and $F_2$ laser light, and the like. Alternatively, a harmonic wave may be used which is obtained by amplifying single-waveform laser light in an infrared region or a visible region emitted from a DFB semiconductor laser or a fiber laser by, for example, a fiber amplifier doped with erbium (or both erbium and ytterbium) and wavelength-converting the laser light into ultraviolet light by using a nonlinear optical crystal.

For example, if the oscillation wavelength of a single-waveform laser is in the 1.51 to 1.59 $\mu$m range, a generated wavelength being an 8x harmonic wave in the 189 to 199 nm range is output, or a generated wavelength being a 10x harmonic wave in the 151 to 159 nm range is output. Especially if the oscillation wavelength is in the 1.544 to 1.553 $\mu$m range, a generated wavelength being an 8x harmonic wave in the 193 to 194 nm range is output, that is, an ultraviolet light with a wavelength approximately equivalent to an ArF excimer laser light can be obtained. If the oscillation wavelength is in the 1.57 to 1.58 $\mu$m range, a generated wavelength being a 10x harmonic wave in the 157 to 158 nm range is output, that is, an ultraviolet light with a wavelength approximately equivalent to an $F_2$ excimer laser light can be obtained.

If the oscillation wavelength is in the 1.03 to 1.12 $\mu$m range, a generated wavelength being an 7x harmonic wave in the 147 to 160 nm range is output, and, especially if the oscillation wavelength is in the 1.09 to 1.106 $\mu$m range, a generated wavelength being an 7x harmonic wave in the 157 to 158 $\mu$m range is output, that is, an ultraviolet light with a wavelength approximately equivalent to an $F_2$ excimer laser light can be obtained. In this case, it is possible to use an ytterbium doped fiber laser, for example, as the single-waveform oscillating laser.

In the embodiments described above, the case of the use of a reduction system as a projection optical system was explained. However, the projection optical system may be a unity (1x) system or an enlargement system. In the case of the use of an ArF excimer laser light source or a KrF excimer laser light source, refractive systems comprised of only a refractive optical element (lens element) preferably are used as a light source. However, in the case of the use of a $F_2$ laser light source, an $Ar_2$ laser light source, and the like, a refractive optical element and a reflective optical element (a concave mirror, a beam splitter, and the like) are combined into a so-called catadioptric system as disclosed in, for example, Japanese Laid-Open Patent Publication No. 3-282527 (U.S. Pat. No. 5,220,454), or a reflective optical system comprised of only reflective mirrors are preferably used as a projection optical system PL. However, in the case of the use of a $F_2$ laser light source, it possible to use a refractive system.

In addition to the above, it is possible to use a catadioptric system having a beam splitter and a concave mirror as a reflective optical element as disclosed in, for example, Japanese Laid-Open Patent Publication No. 8-171054 (U.S. Pat. No. 5,668,672), Japanese Laid-Open Patent Publication No. 10-20195 (U.S. Pat. No. 5,835,275), and the like as a catadioptric type projection optical system. It is possible to use a catadioptric system having a concave mirror, and the like without using a beam splitter as a reflective optical element as disclosed in Japanese Laid-Open Patent Publication No. 8-334695 (U.S. Pat. No. 5,689,377), Japanese Laid-Open Patent Publication No. 10-3039 (EP-A1-816 892), and the like.

A plurality of refractive optical elements and two mirrors (a main mirror being a concave mirror, and an auxiliary mirror being a back mirror whereon a reflective surface is formed on the opposite side of the plane of incidence of a refractive mirror or a parallel plane plate) as disclosed in U.S. Pat. Nos. 5,031,976, 5,488,299, and 5,717,518 placed on the same axis, and a catadioptric system to recombine an intermediate reticle pattern image formed by a plurality of refractive optical elements on a wafer by a main mirror and an auxiliary mirror may be used. In a catadioptric system, the main mirror and the auxiliary mirror are placed after a plurality of refractive optical elements, and the illumination light passes through a portion of the main mirror and is in order reflected off the auxiliary mirror and the main mirror, and furthermore, passes through a portion of the auxiliary mirror and arrives onto the wafer.

The catadioptric type projection optical system may have an oval image field, for example, and an object surface and image surface both being telecentric, and may be a reduction system with the projection magnification set at ¼ or ⅕. A scanning exposure apparatus provided with a catadioptric system may be a type specified by a rectangular slit extending along the direction nearly orthogonal to the reticle or wafer scanning direction with the irradiation area of the illumination light being the visual field of the projection optical system with a nearly central optical axis. According to such a scanning exposure apparatus provided with a catadioptric type projection optical system, it is possible to transfer a detailed pattern of about 100 nmL/S with high precision onto a wafer, even when using a 157 nm wavelength $F_2$ laser, for example, as an illumination light for exposure.

An illumination unit, a projection optical system, and the like composed of a plurality of lenses is incorporated in the main body of the exposure apparatus so as to provide for optical adjustment. Various components, such as the reticle stage and wafer stage formed of several components in the main exposure apparatus, are mechanically and electrically combined and adjusted, are subjected to total adjustment (e.g., electrical adjustment and operation check, and the like), thereby making it possible to produce an exposure apparatus according to each embodiment described above. Preferably the exposure apparatus is produced in a clean room in which the temperature, the level of air cleanliness, and the like are controlled.

The invention is also applicable not only to an exposure apparatus for use in the fabrication of semiconductor devices, but also to an exposure apparatus that transfers a device pattern onto a glass plate so as to produce displays, such as liquid crystal displays and plasma displays, an exposure apparatus that transfers a device pattern onto a ceramic wafer so as to produce thin-film magnetic heads, and an exposure apparatus for use in producing image pickup devices, such CCDs. Also, since reticles and masks are used not only to produce micro devices such as semiconductor devices, and the like, but also in light exposure apparatus, EUV exposure apparatus, X-ray exposure apparatus, electron beam exposure apparatus, and the like, it is possible to apply the present invention to exposure apparatus for transferring a circuit pattern to a glass substrate, a silicon wafer, and the like. At this point, in an exposure apparatus using DUV (Deep Ultraviolet) light, VUV (Vacuum Ultraviolet) light, and the like, a reflective type reticle is generally used, and a silicon wafer, and the like is used serving as the mask substrate. Also, in an X-ray exposure apparatus using a proximity method, an electron beam exposure apparatus, and the like, a transmission type mask (stencil mask, membrane mask) is used, and quartz glass serving as a reticle substrate, quartz glass doped with fluorine, fluorite, magnesium fluoride, or quartz crystal are used.

Next, one embodiment of a device manufacturing method which uses the above-described exposure apparatus in a lithographic process will be explained.

Figure 8:
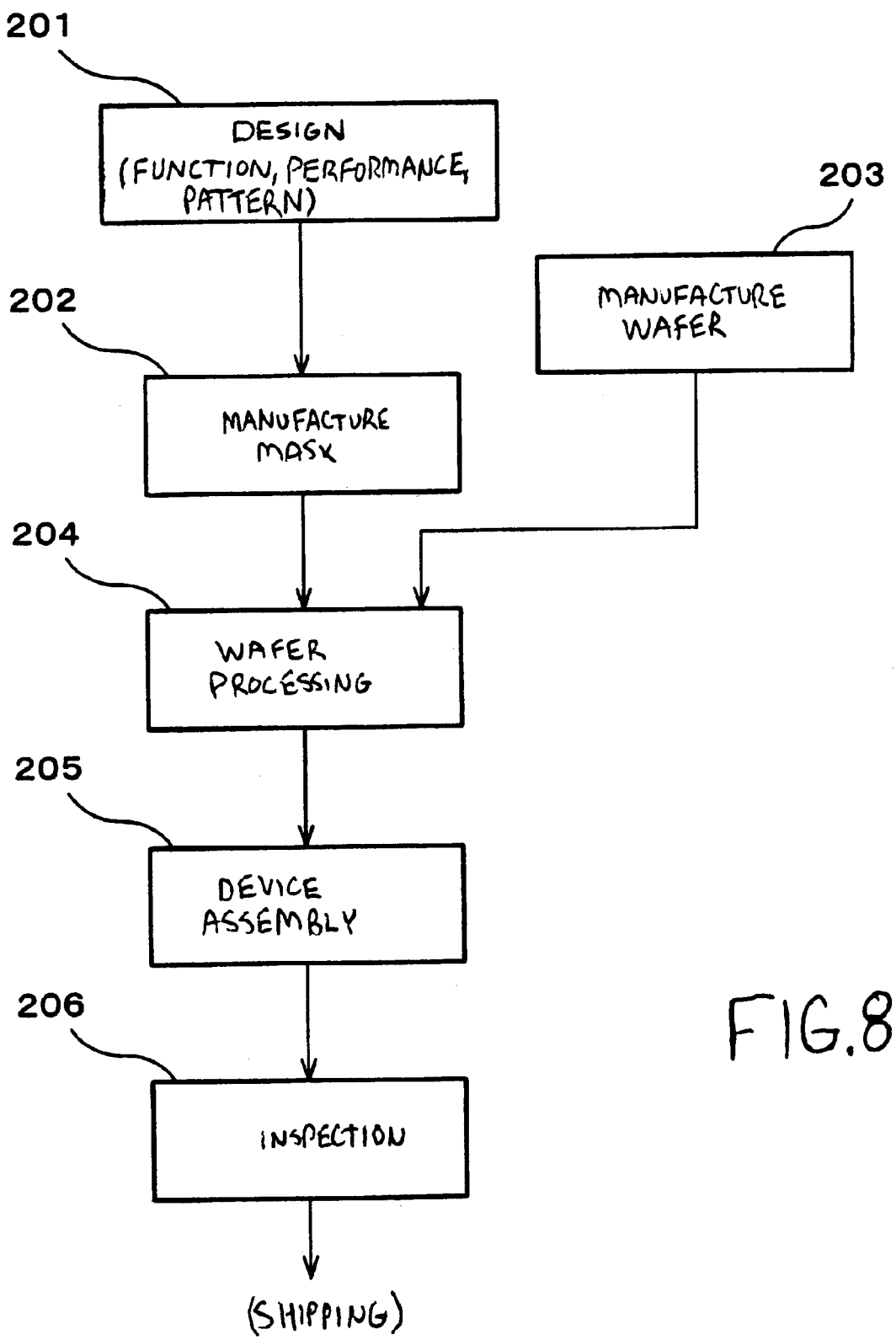
FIG. 8 is a flowchart explaining a device manufacturing method related to the invention.

FIG. 8 is a flowchart of a device (semiconductor chips such as ICs, LSIs, and the like; and liquid crystal displays, CCD, thin film magnetic heads, micro machines, and the like) manufacturing example. First, in step 201 (design step) the functions and performance of a device are designed (for example, semiconductor device circuit design, and the like), and a pattern is designed to realize those functions. Then, in step 202 (mask manufacturing step), a mask formed from the designed circuit pattern is manufactured. In step 203, a wafer is manufactured using materials such as silicon, and the like.

Next, in step 204 (wafer processing step), using the mask and wafer provided by step 201~step 203, a circuit, and the like is actually formed on the wafer by lithographic technology, and the like as will be explained below. Next, in step 205 (device assembly step), the device is assembled using the wafer processed in step 204. In this step 205, processes such as dicing, bonding, packaging (chip sealing), and the like are included as required.

Lastly, in step 206 (inspection step), inspection of the device manufactured in step 205 is performed by an operation check test, a durability check test, and the like. After going through such a process, the device is completed and shipped.

Figure 9:
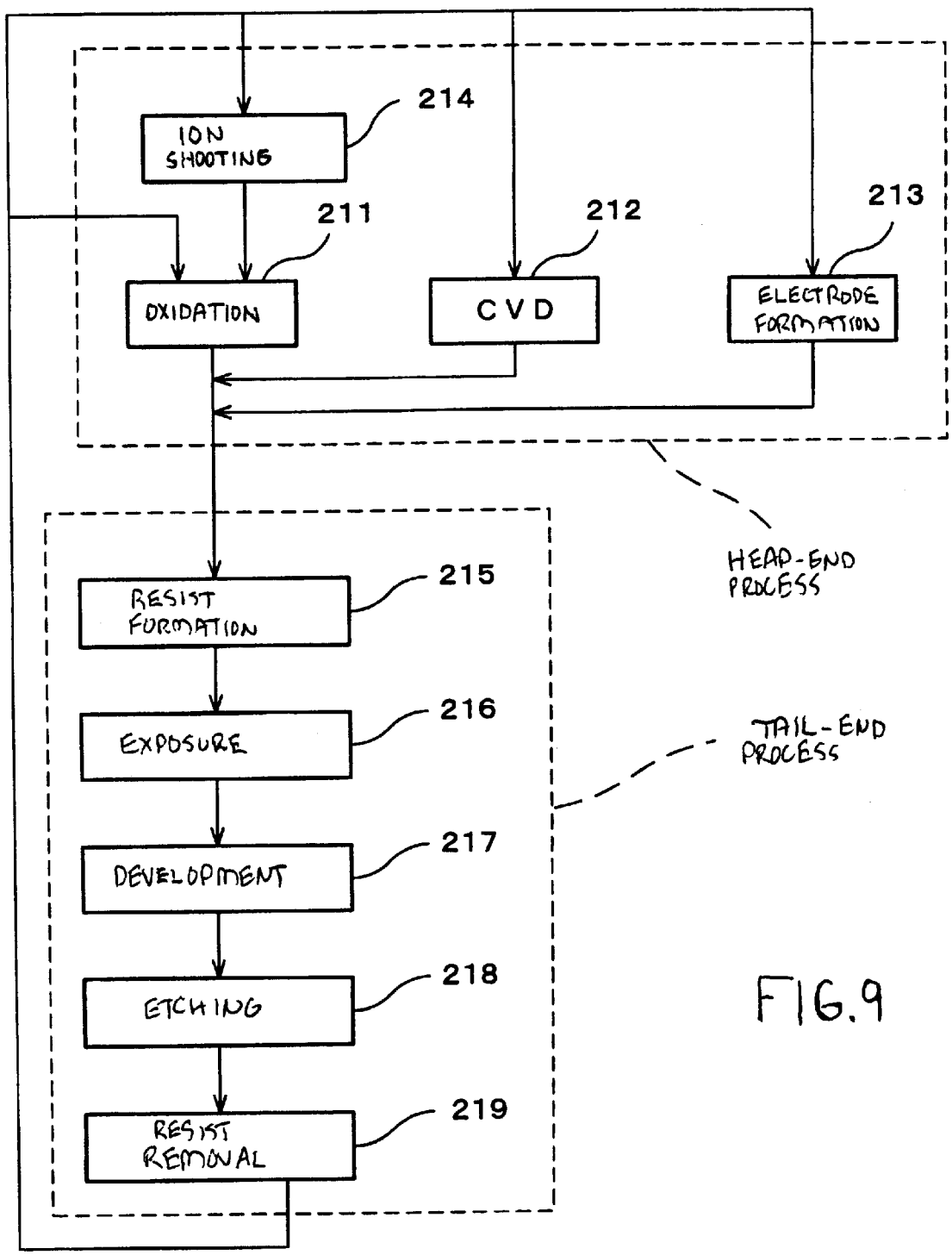
FIG. 9 is a flowchart showing a specific example of the wafer processing step in FIG. 8.

FIG. 9 shows a detailed flow example of step 204 explained above. In FIG. 9, the wafer surface is oxidized in step 211 (oxidation step). In step 212 (CVD step), an insulation film is formed on the wafer surface. In step 213 (electrode formation step), an electrode is formed by vacuum deposition onto the wafer. In step 214 (ion shooting step), ions are shot into the wafer. Each of steps 211~214 above comprise the head-end process of the wafer process, and each step is selected according to the required process and executed.

In each step of the wafer process, the tail-end process is conducted as explained below when the above-explained head-end process is completed. In the tail-end process, a wafer is first doped with a photosensitive agent in step 215 (resist formation step). Next, a circuit pattern of a mask is transferred to the wafer in step 216 (exposure step) by the exposure apparatus of the first or second embodiments explained above. Next, in step 217, the wafer exposed in step 216 (development step) is developed, and the exposed portions except the portions where the resist remains are removed by etching in step 218 (etching step). Then, the unnecessary resist is removed after etching in step 219 (resist removal step).

By repeatedly performing the head-end process and the tail-end process, a multilayered circuit pattern is formed on a wafer.

Since an exposure apparatus in each preferred embodiment above is used in an exposure process (step 216) according to the device manufacturing method in the preferred embodiments as explained above, improved throughput is possible by reduced concurrent settling time, as well as high precision exposure by improved concurrent performance between reticle R and waver W during scanning exposure. As a result of this, it is possible to form a detailed pattern on a waver W with excellent precision, and it is possible to increase the productivity (including yield) of highly integrated devices.

As explained above, with the drive apparatus according to the invention, it is possible to drive an object in a predetermined direction in a predetermined stroke, as well as provide a small, light weight drive apparatus capable of micromotion in the rotation direction and in the orthogonal direction to a predetermined direction.

According to the exposure apparatus of the invention, it is possible to obtain free arrangement of each member in the vicinity of the mask, as well as provide an excellent exposure apparatus capable of high precision exposure not heretofore available.

According to the device manufacturing method of the invention, it is possible to improve the production of highly integrated micro devices. Also, the device manufacturing method of the invention provides a highly integrated micro device wherein detailed patterns are formed with high precision.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A drive apparatus for driving an object within a two dimensional plane including a first axis and a second axis orthogonal to the first axis, the drive apparatus comprising:

a first stage on which the object is placed;

a micromotion mechanism that slightly drives the first stage in a direction of the second axis and in a rotation direction about a third axis orthogonal to the two-dimensional plane;

a second stage that holds the first stage without physically contacting the first stage;

a non-contact holding mechanism disposed between the first stage and the second stage to hold the first stage to the second stage in a non-contact manner while allowing for micromotion of the first stage in the second axis direction and in the rotation direction relative to the second stage;

a macromotion mechanism that drives the second stage in a direction of the first axis; and wherein the second stage, the non-contact holding mechanism, the micromotion mechanism, and the macromotion mechanism all are disposed on one side of the first stage relative to the third axis.

2. A drive apparatus according to claim 1, wherein the non-contact holding mechanism:

includes at least one electromagnet disposed on one of the first stage and the second stage, and magnetic material disposed on the other one of the first stage and the second stage; and slightly drives the first stage relative to the second stage in the first axis direction by adjusting a magnetic strength generated by the at least one electromagnet.

3. A drive apparatus according to claim 2, wherein the non-contact holding mechanism generates micromotion in the first axis direction at a center of gravity position of the first stage.

4. A drive apparatus according to claim 1, wherein the micromotion mechanism:
includes a plurality of voice coil motors comprised of a plurality of moving members disposed on the first stage, and stationary members corresponding to each of the moving members and generating a drive force in the second axis direction by an electromagnetic interaction with the moving members; and
generates micromotion in the second axis direction within the two dimensional plane through a center of gravity of the first stage.

5. A drive apparatus according to claim 1, wherein:
the macromotion mechanism is a linear motor comprised of moving members disposed on the second stage and stationary members to generate a drive force in the first axis direction by electromagnetic interaction with the moving members;
the micromotion mechanism includes a plurality of voice coil motors comprised of moving members disposed on the first stage, and stationary members corresponding to each of the moving members to generate a drive force in the second axis direction by an electromagnetic interaction with the moving members; and further comprising:
a frame on which is disposed the stationary members of the linear motor, each stationary member of the plurality of voice coil motors, a first guide to support the second stage in a non-contact manner with respect to the second axis direction, and a second guide to support the first and second stages in a non-contact manner with respect to the third axis direction.

6. A drive apparatus according to claim 5, further comprising a supporting mechanism that freely movably supports the frame in a non-contact manner such that a reaction force that is generated by driving of the first and second stages by the micromotion mechanism and by the macromotion mechanism causes the frame to move according to the law of conservation of momentum.

7. A drive apparatus according to claim 5, further comprising a vacuum preload hydrostatic gas bearing disposed on each opposing surface of the first and second guides of the first and second stages, and a compressed gas exhaust nozzle and an exhaust groove linked to a vacuum exhaust duct formed about the exhaust nozzle disposed on each bearing surface of the hydrostatic gas bearing.

8. A drive apparatus according to claim 5, wherein the first stage is held in a cantilever manner by at least one of the frame and the second stage.

9. An exposure apparatus for transferring a pattern of a mask onto a substrate while synchronously moving the mask and the substrate, the exposure apparatus comprising:
the drive apparatus according to claim 1, wherein the mask serves as the object and is placed on the first stage; and
a substrate stage that holds the substrate and that moves synchronously with the first stage in the first axis direction during an exposure operation.

10. A device manufacturing method including a lithographic process for exposing a substrate with an image of a mask, said method utilizing the exposure apparatus according to claim 9.

11. A micro device made by the method of claim 10.

12. A drive apparatus for driving an object within a two dimensional plane including a first axis and a second axis orthogonal to the first axis, the drive apparatus comprising:
a first stage on which the object is placed, the first stage is movable in a first axis direction along the first axis, in a second axis direction along the second axis, and in a rotation direction around a third axis that is orthogonal to the two-dimensional plane;
a second stage that holds the first stage without physically contacting the first stage, the second stage disposed on a single side of the first stage, the single side being displaced from the third axis;
a non-contact holder disposed between the first stage and the second stage to hold the first stage to the second stage in a non-contact manner while allowing for micromotion of the first stage relative to the second stage in the second axis direction and in the rotation direction, the non-contact holder disposed on the single side of the first stage;
a micromotion driver disposed on the single side of the first stage and that drives the first stage in the second axis direction and in the rotation direction; and
a macromotion driver disposed on the single side of the first stage and that drives the second stage in the first axis direction.

13. A drive apparatus according to claim 12, wherein the non-contact holder:
includes at least one electromagnet disposed on one of the first stage and the second stage, and magnetic material disposed on the other one of the first stage and the second stage; and
slightly drives the first stage relative to the second stage in the first axis direction by adjusting a magnetic strength generated by the at least one electromagnet.

14. A drive apparatus according to claim 13, wherein the non-contact holder generates micromotion in the first axis direction at a center of gravity position of the first stage.

15. A drive apparatus according to claim 12, wherein the micromotion driver:
includes a plurality of voice coil motors comprised of a plurality of moving members disposed on the first stage, and stationary members corresponding to each of the moving members and generating a drive force in the second axis direction by an electromagnetic interaction with the moving members; and
generates micromotion in the second axis direction within the two dimensional plane through a center of gravity of the first stage.

16. A drive apparatus according to claim 12, wherein:
the macromotion driver is a linear motor comprised of moving members disposed on the second stage and stationary members to generate a drive force in the first axis direction by electromagnetic interaction with the moving members;
the micromotion driver includes a plurality of voice coil motors comprised of moving members disposed on the first stage, and stationary members corresponding to each of the moving members to generate a drive force in the second axis direction by an electromagnetic interaction with the voice coil moving members; and further comprising:
a frame on which is disposed the stationary members of the linear motor, each stationary member of the plurality of voice coil motors, a first guide to support the second stage in a non-contact manner with respect to the second axis direction, and a second guide to support the first and second stages in a non-contact manner with respect to the third axis direction.

17. A drive apparatus according to claim 16, further comprising a supporting mechanism that freely movably supports the frame in a non-contact manner such that a reaction force that is generated by driving of the first and second stages by the micromotion driver and by the macromotion driver causes the frame to move according to the law of conservation of momentum.

18. A drive apparatus according to claim 16, further comprising a vacuum preload hydrostatic gas bearing disposed on each opposing surface of the first and second guides of the first and second stages, and a compressed gas exhaust nozzle and an exhaust groove linked to a vacuum exhaust duct formed about the exhaust nozzle disposed on each bearing surface of the hydrostatic gas bearing.

19. A drive apparatus according to claim 16, wherein the first stage is held in a cantilever manner by at least one of the frame and the second stage.

20. An exposure apparatus for transferring a pattern of a mask onto a substrate while synchronously moving the mask and the substrate, the exposure apparatus comprising:
   the drive apparatus according to claim 12, wherein the mask serves as the object and is placed on the first stage; and
   a substrate stage that holds the substrate and that moves synchronously with the first stage in the first axis direction during an exposure operation.

21. A device manufacturing method including a lithographic process for exposing a substrate with an image of a mask, said method utilizing the exposure apparatus according to claim 20.

22. A micro device made by the method of claim 21.

23. A method of driving an object within a two dimensional plane including a first axis and a second axis orthogonal to the first axis, the method comprising the steps of:
   placing the object on a first stage that is movable in a first axis direction along the first axis, in a second axis direction along the second axis, and in a rotation direction around a third axis that is orthogonal to the two-dimensional plane;
   holding the first stage with a second stage that holds the first stage without physically contacting the first stage, the second stage disposed on a single side of the first stage, the single side being displaced from the third axis, the second stage holding the first stage while allowing for micromotion of the first stage relative to the second stage in the second axis direction and in the rotation direction;
   driving the first stage in at least one of the second axis direction and the rotation direction by a micromotion driver disposed on the single side of the first stage; and
   driving the second stage in the first axis direction by a macromotion driver disposed on the single side of the first stage.

24. A method according to claim 23, wherein the first stage is driven in the first axis direction through a center of gravity position of the first stage.

25. A method according to claim 23, wherein:
   the macromotion driver is a linear motor comprised of moving members disposed on the second stage and stationary members to generate a drive force in the first axis direction by electromagnetic interaction with the moving members;
   the micromotion driver includes a plurality of voice coil motors comprised of moving members disposed on the first stage, and stationary members corresponding to each of the moving members to generate a drive force in the second axis direction by an electromagnetic interaction with the voice coil moving members; and further comprising:
   disposing the stationary members of the linear motor, each stationary member of the plurality of voice coil motors, a first guide to support the second stage in a non-contact manner with respect to the second axis direction, and a second guide to support the first and second stages in a non-contact manner with respect to the third axis direction on a frame.

26. A method according to claim 25, further comprising freely movably supporting the frame in a non-contact manner such that a reaction force that is generated by driving of the first and second stages by the micromotion driver and by the macromotion driver causes the frame to move according to the law of conservation of momentum.

27. A method according to claim 25, wherein the first stage is held in a cantilever manner by at least one of the frame and the second stage.

28. A method of transferring a pattern of a mask onto a substrate while synchronously moving the mask and the substrate, the method comprising:
   mounting the mask as the object on the first stage according to the method of claim 23; and
   holding the substrate on a substrate stage that that moves synchronously with the first stage in the first axis direction during an exposure operation.

* * * * *